(12) United States Patent
Sato et al.

(10) Patent No.: US 8,207,745 B2
(45) Date of Patent: Jun. 26, 2012

(54) ANOMALY MONITORING DEVICE

(75) Inventors: Ikuya Sato, Tokyo (JP); Hiroshi Takahashi, Tokyo (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 344 days.

(21) Appl. No.: 12/705,393

(22) Filed: Feb. 12, 2010

(65) Prior Publication Data

US 2010/0201373 A1 Aug. 12, 2010

(30) Foreign Application Priority Data

Feb. 9, 2009 (JP) .................................. 2009-027517
Mar. 3, 2009 (JP) .................................. 2009-049375
May 13, 2009 (JP) .................................. 2009-116207

(51) Int. Cl.
*G01R 31/02* (2006.01)
*H01H 31/02* (2006.01)

(52) U.S. Cl. ...................................... 324/539; 324/555

(58) Field of Classification Search .................. 324/539, 324/537, 500, 555, 456, 237, 238, 240, 718, 324/216; 702/35, 33, 1
See application file for complete search history.

(56) References Cited

U.S. PATENT DOCUMENTS

| 4,697,142 | A | * | 9/1987 | Frushour ........................ 324/537 |
| 4,768,155 | A | * | 8/1988 | Takishita et al. ................ 702/39 |
| 5,355,129 | A | * | 10/1994 | Baumann ................. 340/870.04 |
| 6,828,815 | B2 | * | 12/2004 | Ishida et al. ............. 324/762.03 |
| 2008/0231286 | A1 | | 9/2008 | Tsunekazu et al. |

FOREIGN PATENT DOCUMENTS

JP 2008-232978 A 10/2008

* cited by examiner

*Primary Examiner* — Hoai-An D Nguyen
(74) *Attorney, Agent, or Firm* — Rabin & Berdo, P.C.

(57) ABSTRACT

In an anomaly monitoring device, in which an output signal from an encoder is input as an analog input signal via a wiring system, for detecting anomalies in the encoder or the wiring system, provided are a voltage level based device, a pulse number based device and a pulse width based device. The voltage level based device detects anomalies when the voltage level of the analog input signal exists within a prescribed range. The pulse number based device detects anomalies when the difference in the numbers of pulses of digital signals corresponding to the analog input signals is equal to or greater than a prescribed threshold value. The pulse width based device detects anomalies when the pulse width of the digital signals, measured from a combined signal of the digital signals or each of the digital signals, is different from the pulse width in a past control period.

28 Claims, 18 Drawing Sheets

AT "L" LEVEL        AT "H" LEVEL (CABLE BREAK)

(SHORT-CIRCUIT WITH $V_c$)

(GROUNDED)

ANOMALY MONITORING DEVICE

CROSS-REFERENCE TO RELATED APPLICATION

This application claims priority to and the benefit of Japanese Patent Applications No. 2009-027517 (filed on Feb. 9, 2009), No. 2009-049375 (filed on Mar. 3, 2009) and No. 2009-116207 (filed on May 13, 2009), the disclosure of which are incorporated herein by reference in its entirety.

BACKGROUND OF THE INVENTION

1. Field of the Invention

This invention relates to an anomaly monitoring device which detects anomalies of pulse encoders (hereafter simply called "encoders") and anomalies of wiring systems to implement safety functions in, for example, a power converter such as an inverter and a servo system for driving a motor.

2. Description of the Related Art

Inverters and servo systems which compute motor speed and rotor position from output signals of a pulse encoder mounted on the output shaft of a motor, and which feed back these computed values in variable-speed driving of the motor, are in widespread use. In such devices, normal equipment operation is difficult if there are anomalies in the encoder output signals, and so in the past various proposals have been made for methods to detect anomalies in encoders and anomalies in wiring systems, to halt operation.

For example, in Japanese Patent Application Laid-open No. 2008-232978, a wiring anomaly detection device is disclosed in which, by utilizing internal functions of a microprocessor for anomaly monitoring, the number of components can be reduced, circuits can be reduced to the bare minimum, and cost can be decreased.

In this technology of the prior art (for convenience, called the first conventional technology), first the encoder output signal is input to the wiring anomaly detection device as an analog signal. Then, the analog signal is A/D (analog/digital)-converted, and if the converted voltage level is a prescribed intermediate voltage level excluding transient states, then it is judged that incomplete contact or a short-circuit is occurring in the signal system, and an anomaly is detected.

Below, the configuration and operation of a circuit of this conventional technology is explained, referring to FIG. 23.

In FIG. 23, the wiring anomaly detection device 100 includes a microprocessor 120, program memory 121, AD converter 123, constant-voltage power supply circuit 130, buffer amplifier 135, series resistors 131a, 131b, filter capacitors 132a, 132b, and pull-down resistors 134a, 134b. Also, 122 is memory within the microprocessor 120.

Further, 110 is a rotary encoder used to detect the rotation angle of the motor (not shown). This encoder 110 includes a rotation angle detection circuit 115, which outputs signals with two phases (A phase and B phase) as rotation angle detection signals; sensor switches 111a, 111b, as transistors for A phase and B phase signal output; dropper diodes 112a, 112b, 113a, 113b; and bleeder resistors 114a, 114b.

Further, 101 is a DC power supply, 102 is a power supply switch, 103 is a ground line, 104 is a power supply line, and 105 and 106 are signal lines.

Also, A and B in the encoder 110 are output terminals for A phase signals and B phase signals. A1 and A2 in the wiring anomaly detection device 100 are analog input signals, D1 and D2 in the microprocessor 120 are open/close logic signals for the sensor switches 111a, 111b, and Vm is a monitored voltage.

As the operation of the rotary encoder 110, when the sensor switches 111a, 111b are turned on or off by output signals of the rotation angle detection circuit 115, through action of the dropper diodes 112a, 112b, 113a, 113b and the bleeder resistors 114a, 114b, a voltage drop occurs. The voltage of this voltage drop is output from the output terminals A, B as the A phase signal and B phase signal, and by inputting the voltage to the wiring anomaly detection device 100 via the signal lines 105, 106, anomaly detection operation is performed as described below.

FIG. 24 shows characteristics of the analog input signals A1, A2 of the A phase and B phase input to the wiring anomaly detection device 100. Below, characteristics of the analog input signal A1 for the A phase are explained, but operation is entirely similar for the analog input signal A2 of the B phase.

When the sensor switch 111a turns on, the on-voltage drop across the dropper diode 112a causes the voltage VL of FIG. 24 to be detected. On the other hand, when the sensor switch 111a turns off, the voltage drop across the bleeder resistor 114a and dropper diode 113a causes the voltage level VH to be detected. In actuality, taking scattering in the characteristics of the dropper diodes 112a, 113a into consideration, constant ranges centered on the voltage levels VL and VH are taken to be the normal "L" level and the normal "H" level respectively.

By judging whether the voltage level of an analog input signal is "L" level or "H" level in this way, the presence or absence of a rotation angle detection pulse is detected.

At this time, when for example a line break or ground fault is occurring in the signal line 105, the above-described voltage drop component is not detected, and the analog input signal is fixed at ground level, so that anomaly occurrence can be detected.

And, when the output terminal A of the encoder 110 is short-circuited to the positive-side power supply Vcc, the analog input signal is fixed at a voltage level higher than VH, so that occurrence of an anomaly can similarly be detected. Further, when there is incomplete contact with the positive-side power supply Vcc and with ground, or when contact with another signal line occurs, the analog input signal is detected as the intermediate voltage level (logic judgment level) Vs1 or Vs2 in FIG. 24, and an anomaly is also judged when these intermediate voltage levels Vs1 or Vs2 continue for a fixed period.

During on/off switching of the sensor switch 111a, the voltage waveform of the A phase analog input signal A1 is filtered by the low-pass filter including the series resistor 131a and the filter capacitor 132a. Hence depending on the sampling timing, the intermediate voltage levels Vs1 and Vs2 may be detected transiently even during normal operation, so that there is the concern that an anomaly may be erroneously detected as a result.

In order to prevent such erroneous detection, when in this conventional technology an intermediate voltage level Vs1 or Vs2 is detected, detailed judgment is executed. And, a judgment is made as to whether the intermediate voltage level Vs1 or Vs2 has occurred transiently or has continued for a fixed period; if the level has continued for a fixed period, the above-described anomaly due to incomplete contact with the positive-side power supply Vcc or ground, or due to contact with another signal line, is judged to have occurred.

In other conventional technology (for convenience, called the second conventional technology), a method is known in which, after two-phase signals output from an encoder (an A phase signal and B phase signal with different phases) are A/D converted, the signals are input to a separate counter and the number of pulses counted for each over a fixed period, and anomalies are detected based on these numbers of pulses.

For example, when the motor is rotating, numbers of pulses corresponding to the rotation speed are measured as A phase signals and B phase signals; but when the signal line for one of the phases breaks or comes into contact with the power supply line or ground line, errors occur in the number of pulses for each phase. Hence by comparing the number of pulses for each phase, anomalies can be detected. Further, by comparing the speed detection values equivalent to the numbers of pulses for each phase with the current speed instruction value or another value, anomalies not only in one of the phases alone, but simultaneous anomalies in the two phases can also be detected.

Next, problems with these conventional technologies are explained.

By means of the first conventional technology, even when the motor is stopped, a wiring anomaly can be detected according to the voltage level of the analog signal input to the wiring anomaly detection device 100. However, during operation of the motor, wiring anomaly judgment is difficult, and even when wiring is normal there is the concern that an erroneous judgment of an anomaly may be made. The reason for this is as follows.

For encoders in general, the number of output signals per single mechanical period (in the case of a rotary motor, per single rotation) of a motor or other rotation member is determined, and as the speed increases the interval between output signals becomes shorter. On the other hand, a microprocessor or other processing unit normally performs processing in a fixed period, so that it does not infrequently occur that the interval of output signals from the encoder become much shorter than the processing period of the processing unit.

If at such times the sampling timing of the AD converter on the processing unit side happens to coincide with the time at which the output signal from the encoder changes, an intermediate voltage level is detected continuously, as described above, and so there are cases in which it is erroneously judged that an anomaly has occurred, even though the wiring system is normal.

FIG. 25 is a timing chart showing the encoder output signal, AD conversion sampling timing, the power supply voltage Vc, the detected value of the voltage level of the analog input signal, and the ground level at the time of the above-described erroneous judgment.

As shown in the figure, when the period of the AD conversion sampling timing is a specific multiple of the period of the encoder output signals, the detected values at each of the sampling timings are the same, and so there is the possibility that the voltage value of the analog input signal will be erroneously regarded as fixed at an intermediate voltage level (that is, anomalous).

In order to avoid such erroneous judgments and enhance the reliability of the device, use of a fast AD converter with a short sampling timing period is effective; but fast AD converters are generally expensive, and so there is the problem that the device cost is increased.

On the other hand, in the second conventional technology, due to the principle of anomaly detection based on the numbers of pulses for two phases, anomaly detection is not possible in a state in which the motor is stopped. Hence means of anomaly detection while the motor is stopped must be separately prepared, and this results in increased costs.

Further, if the first conventional technology and the second conventional technology are combined, then an anomaly detection device can be configured which can be employed both when the motor is operating and when the motor is stopped; however, anomaly detection is not possible in cases such as the following.

(1) Case in which the phase of the two-phase output signals of the encoder are anomalous This is a case in which, due to partial short-circuiting of a signal line for example, the interval between the output signals of the two phases fluctuates temporarily.

In this case, the anomaly can only be detected when output signals from the encoder appear due to operation of the motor; and detection is not possible merely by comparing numbers of pulses, as in the second conventional technology.

(2) In this case, ordinarily a difference should appear between the numbers of pulses for the two phases due to the anomaly, but because of noise or other causes the output signals oscillate, and so the numbers of pulses for the two phases coincide.

In addition to the above, there are other cases as well in which for other reasons, no difference occurs in the number of pulses during occurrence of an anomaly, so that the anomaly cannot be detected.

SUMMARY OF THE INVENTION

Hence an object of the invention is to provide a highly reliable anomaly monitoring device, which is capable of detecting various anomalies which cannot be detected by conventional technologies.

Another object of the invention is to provide an inexpensive anomaly monitoring device utilizing the functions of a microcomputer or other processing unit.

In order to attain the above objects, in this invention, an output signal of an encoder which detects the position of a rotation member is input to a control device as an analog signal, and anomalies occurring when the rotation member is stopped are detected based on the voltage level of the analog input signals. Further, when the rotation member is rotating, digital signals obtained by converting analog input signals in at least two phases are used, and the differences in the number of pulses in a fixed period for each of the phases are compared with a prescribed threshold value. Further, the pulse width of a combined signal obtained by combining two or more digital signals with different phases, or the pulse widths of digital signals of different phases, are each monitored to detect anomalies.

That is, in an anomaly monitoring device of this invention, position detection signals with for example two phases, output from an encoder, are input to a control device as analog signals, via a cable or other wiring system.

This control device includes a voltage level based device, a pulse number based device and a pulse width device for detecting anomalies of the encoder or wiring system; these anomaly detection devices are realized by for example a microcomputer as a processing unit.

The voltage level based device detects the voltage level of an analog input signal from the digital signal obtained by performing A/D conversion of the analog input signal, and when this voltage level exists within a prescribed range, judges that an anomaly exists in the encoder or wiring system.

The pulse number based device determines the difference in the numbers of pulses of digital signals corresponding to analog input signals with two phases, and when this difference is equal to or greater than a prescribed threshold value, judges that an anomaly exists in the encoder or wiring system.

Further, the pulse width based device combines digital signals with two phases used by the pulse number based device, and when the pulse width of this combined signal differs from past pulse widths, judges that an anomaly exists in the encoder or wiring system.

The pulse width based device alternatively judges that an anomaly exists in the encoder or wiring system when the pulse widths of the digital signals with two phases differ from the respective past pulse widths, or differ from the pulse widths for other phases.

By means of the voltage level based device, anomalies can be detected while the rotation member is stopped, and by means of the pulse number based and pulse width based devices, anomalies can be detected while the rotation member is rotating.

The control device includes a bias generation device, such that when the encoder output is at "High" level, the voltage level of the analog input signal is an analog high level resulting by subtracting a bias portion from a power supply voltage, and moreover, when the encoder output is at "Low" level, the voltage level of the analog input signal is an analog low level resulting by adding a bias portion to the ground level. Such a bias generation device can for example be implemented by means of a plurality of voltage-dividing resistors, connected between the power supply line, signal lines, and ground line.

When the voltage level of the analog input signal exists between the analog high level and the analog low level, the voltage level based device judges that a break in the signal line or power supply line has occurred. And, when the voltage level of the analog input signal is closer to the power supply voltage than to the analog high level, it is judged that the signal line has short-circuited with the power supply line, and when the voltage level of the analog input signal is closer to ground level than to the analog low level, it is judged that the signal line is grounded.

The pulse number based device detects the edges of pulses of digital signals with two phases, determined the respective number of pulses, and when the difference in the numbers of pulses is equal to or greater than a prescribed threshold value, detects anomalies.

The pulse width based device compares the pulse width of the combined signal of digital signals with two phases in the current control period with the pulse width in for example the preceding control period, and when these pulse widths are different, detects anomalies.

The pulse width based device alternatively detects anomalies upon comparing the pulse widths of digital signals with two phases with respective past pulse widths and judging that these pulse widths are different, or upon comparing the pulse width of a digital signal with a certain phase with the pulse width for another phase and judging that these pulse widths are different.

In this invention, it is desirable that, by utilizing the A/D conversion and counter functions of the microcomputer and timer functions, the major functions of the aforementioned devices be implemented.

Further, by incorporating a plurality of microcomputers into the control device for redundancy, with each microcomputer including each of the anomaly detection devices, detection data can be transmitted and received among microcomputers, and each microcomputer can compare other detection data with its own, so that anomalies relating to the communication functions internal to microcomputers and similar can also be detected.

Also, in this invention an anomaly monitoring device can be configured such that a plurality of signals with different phases which are output signals of an encoder detecting the position of a rotation member can be input to a control device as a plurality of sets of difference signals, via a wiring system including a power supply line and signal lines, and the control device can process the sets of difference signals and detect anomalies in the encoder or wiring system.

In this case, the control device includes the following voltage level based, pulse number based and pulse width based devices.

That is, the voltage level based device converts each of the sets of difference signals into digital signals with reference to the ground potential of the control device, and detects anomalies in the encoder or wiring system based on the numbers of pulses of these digital signals. The pulse number based device detects anomalies in the encoder or wiring system based on pulse widths of the digital signals. The pulse width based device converts at least one of the sets of differential signals into an analog signal with a prescribed level using a voltage level measurement device, detects the voltage level of the analog signal from the digital signal obtained by converting the analog signal, and detects anomalies in the encoder or wiring system.

The pulse width based device may be configured to include, as the voltage level measurement device, either a dual-power supply analog computation device to which at least one of the sets of differential signals are input, or an analog operation device which is a single-power supply type with an offset voltage superposed, and to which at least one of the sets of differential signals are input; when the voltage level of analog signals output from these analog operation devices is outside a normal range on the positive side and outside a normal range on the negative side, anomalies in the encoder or wiring system are detected. Further, a configuration may be employed in which, during rotation of the rotation member, anomalies are detected by the pulse number based or pulse width based device, and while the rotation member is stopped, anomalies are detected by the voltage level based device.

By these devices, even when a line driver-type encoder is used, a set of differential signals can be converted into an analog signal of prescribed level by the voltage level measurement device in the voltage level based device, and anomalies in the encoder itself or in the wiring system can be detected based on the voltage level while the rotation member is stopped. And, during rotation of the rotation member, anomaly detection is possible by the pulse number based or pulse width based device, based on digital signals obtained by converting analog signals.

In particular, additional provision of an AD conversion portion is not necessary, so that there are no concerns of increased device space or cost, and in addition detection of breaks in a single line among two differential signal lines is possible, so that anomaly detection precision can be improved.

DESCRIPTION OF THE PREFERRED EMBODIMENTS

Figure 1:
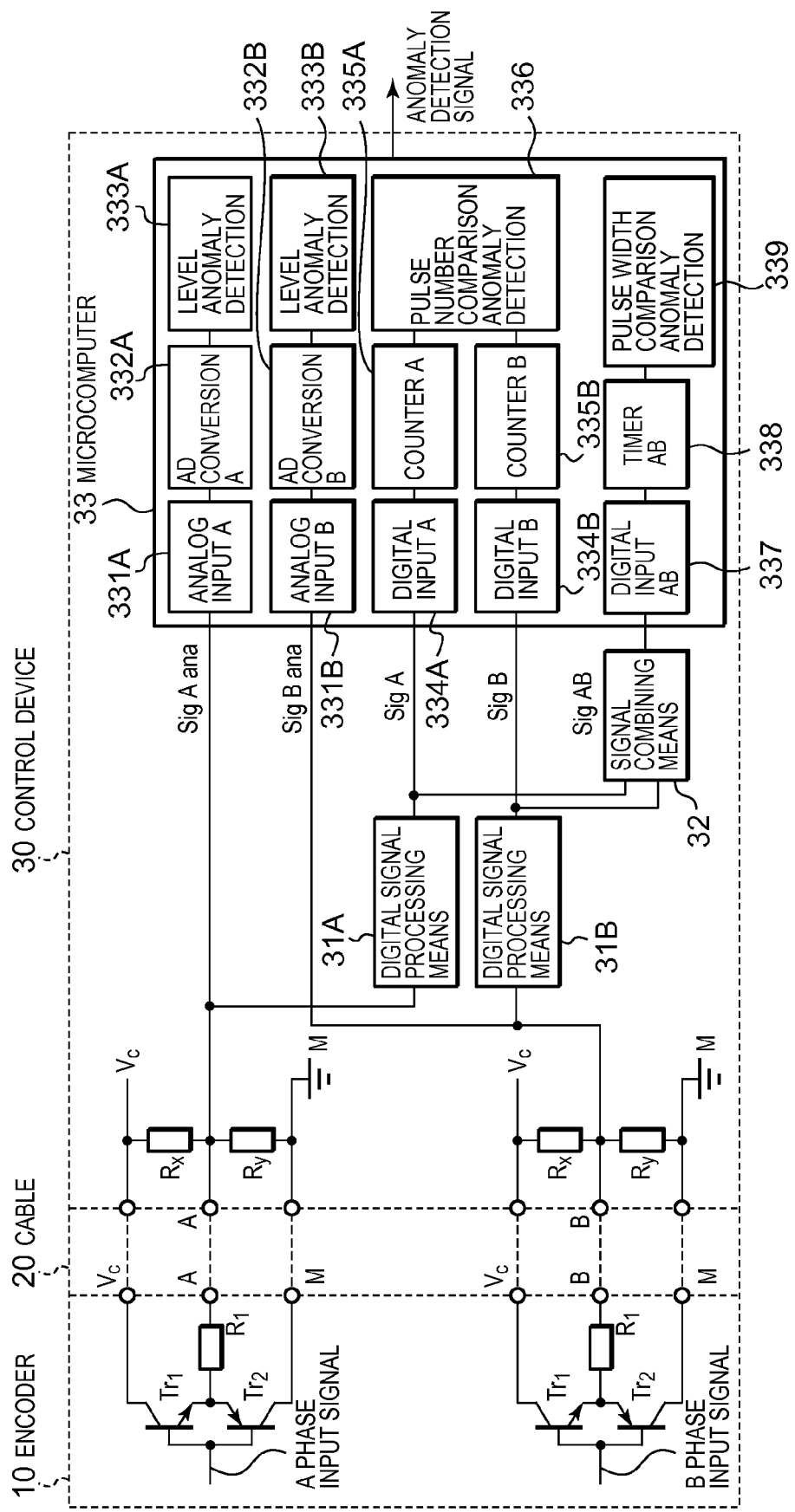
FIG. 1 is a circuit diagram showing a first embodiment of the invention.

Below, embodiments of the invention are explained referring to the drawings.

FIG. 1 is a circuit diagram showing a first embodiment of the invention. In FIG. 1, 10 is an encoder which outputs analog signals with two phases, different by 90°; is a cable, including power supply lines, signal lines, and ground lines; and 30 is a control device which processes output signals of the encoder 10 and detects anomalies of the encoder 10 anomalies of the wiring system including the cable 20.

The encoder 10 includes an optical sensor which generates two relative position detection signals (A phase signals and B phase signals) with phase differing by 90°. The rotation member and the optical sensor are omitted from the drawing.

Figure 23:
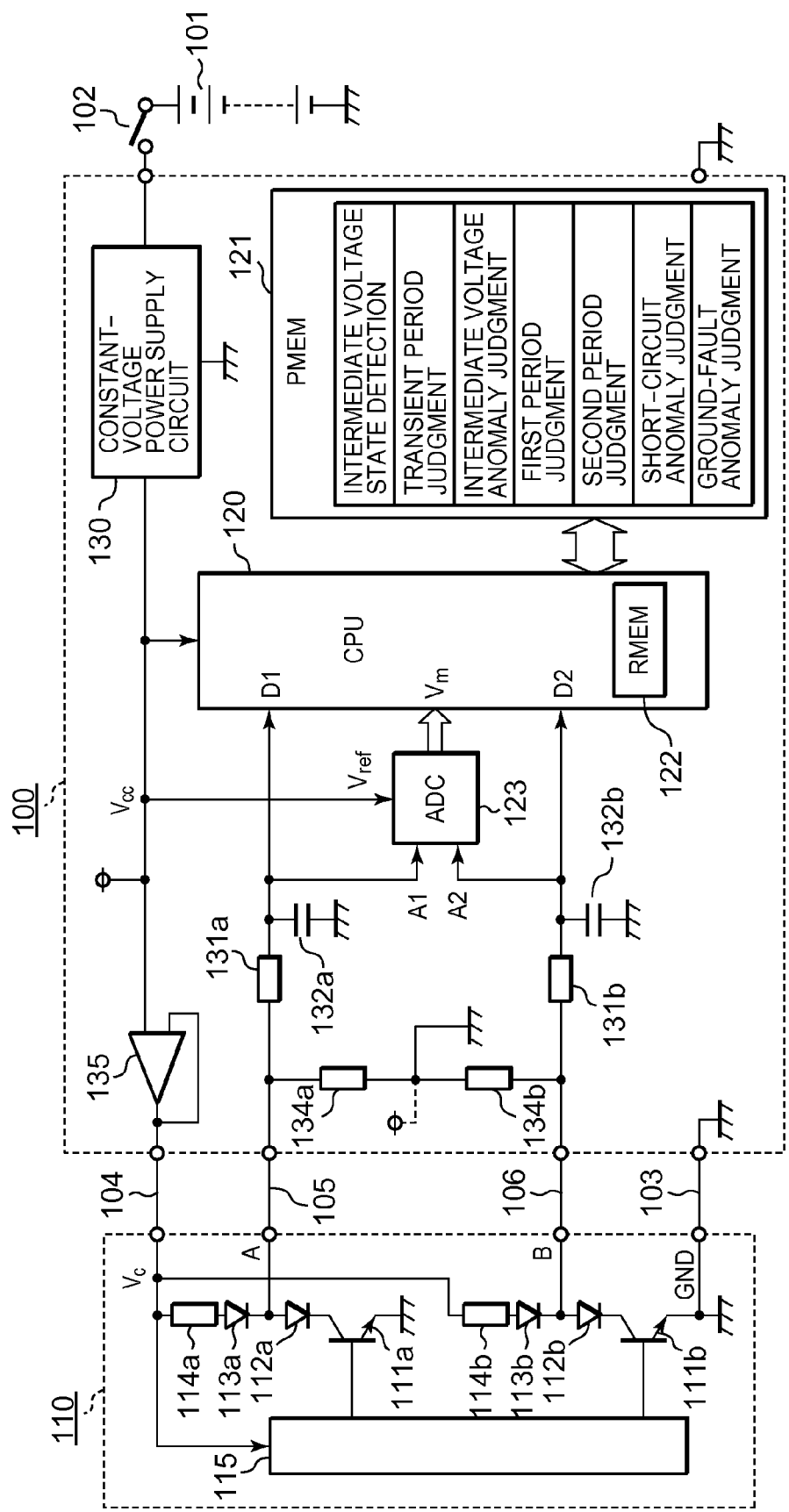
FIG. 23 is a circuit diagram of a wiring anomaly detection device in the first conventional technology.
Figure 24:
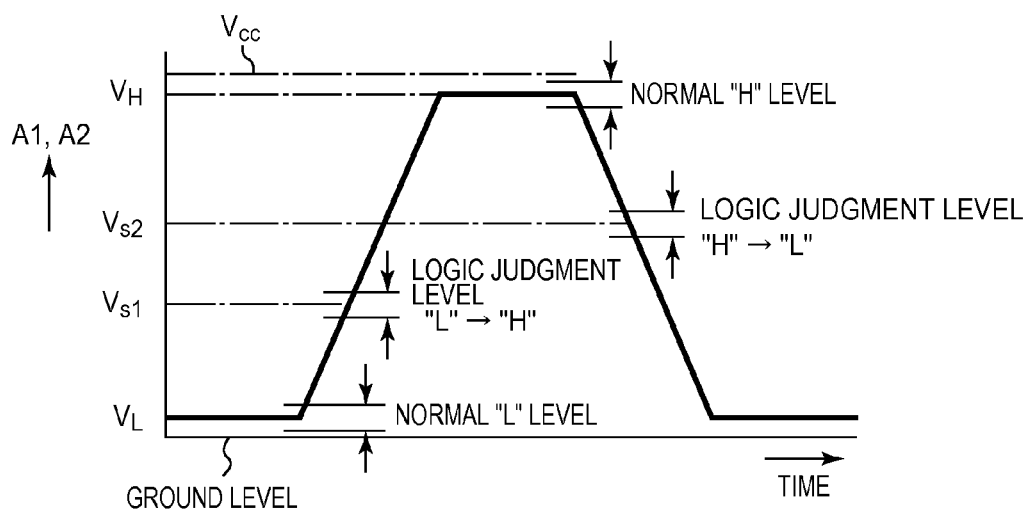
FIG. 24 shows characteristics of analog input signals of the wiring anomaly detection device in FIG. 23.
Figure 25:
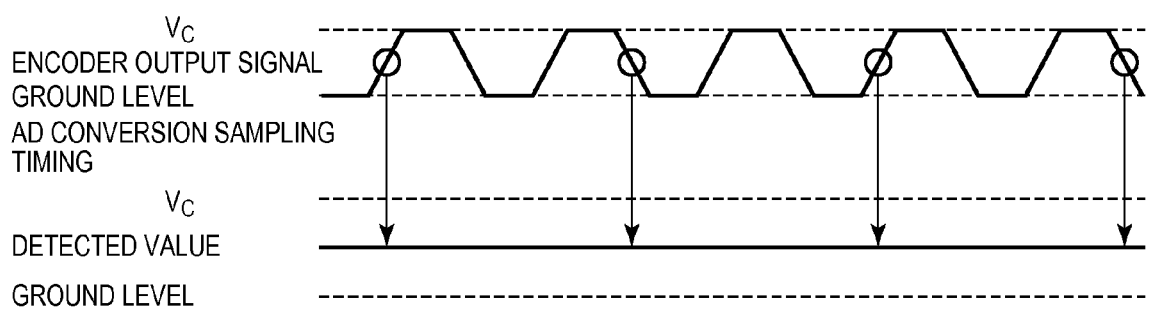
FIG. 25 is a timing chart used to explain problems with the first conventional technology.

The A phase signals and B phase signals are respectively input to the bases of transistors Tr1, Tr2 with a complementary configuration. Here, the processing circuits for A phase signals and for B phase signals have the same configuration, and in addition to the complementary configuration of this embodiment, a complementary configuration such as that of the conventional technology of FIG. 23 may also be employed.

The collector of one of the transistors Tr1 is connected to the power supply terminal Vc (the power supply voltage is also denoted by Vc), and the collector of the other transistor Tr2 is connected to the ground terminal M. The points of connection of the two transistors Tr1, Tr2 each are connected, via a limiting resistor R1, to the A phase signal terminal A and B phase signal terminal B respectively.

The power supply voltage Vc is supplied to the encoder 10 from the control device 30 via the cable 20, and electrical signals of different portions of the encoder 10 take as reference a potential common to the control device 30. The power supply circuitry within the control device 30 is omitted from the drawing.

Normally, in order to prevent effects due to noise, the A phase signal terminal A, B phase signal terminal B, and other portions in FIG. 1 are electrically insulated from the encoder 10 and control device 30 by a photocoupler and insulating amplifier; but in this embodiment, to simply the explanation the potential is made the same as in the encoder 10 and control device 30.

Next, in the control device 30, voltage-dividing resistors Rx, Ry are connected as a bias generation device between the power supply terminal Vc, A phase signal terminal A and ground terminal M, and between the power supply terminal Vc, B phase signal terminal B, and ground terminal M. These voltage-dividing resistors Rx, Ry may be set to values which are appropriate relative to the limiting resistor R1 within the encoder 10, and the on resistance of a diode or a Zener diode may be used.

When the A phase signal output from the encoder 10 is at "H" (High) level (the state in which the transistor Tr1 is turned on and the transistor Tr2 is turned off), if the on voltage drop of transistor Tr1 is ignored, the analog voltage Vadet of the A phase signal terminal A detected by the control device 30 (equivalent to the voltage if the analog signal SigAana in FIG. 1) is expressed by equation (1) below.

$$V_{adet} = \frac{R_y}{R_1 + R_y} V_c \qquad (1)$$

On the other hand, when the A phase signal is at "L" (Low) level (the state in which the transistor Tr1 is turned off and the transistor Tr2 is turned on), if the on voltage drop of transistor Tr2 is ignored, the analog voltage Vadet of the A phase signal terminal A is expressed by equation (2) below.

$$V_{adet} = \frac{R_1}{R_1 + R_x} V_c \qquad (2)$$

Figure 2:
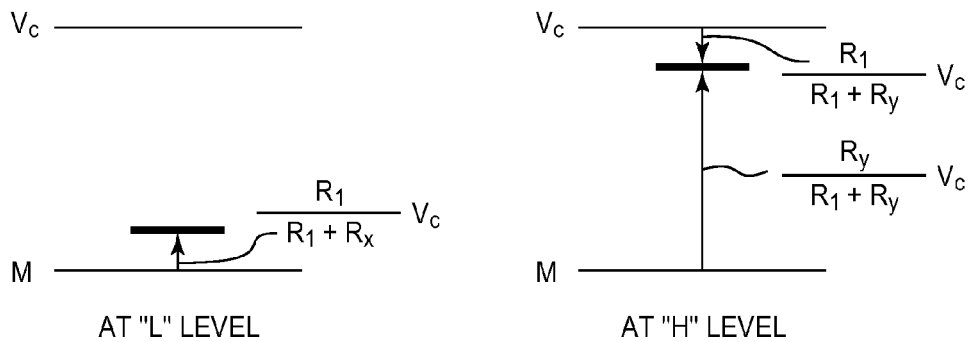
FIG. 2 shows the voltage level of analog signals during normal operation in FIG. 1.

That is, in normal operation in which the encoder 10 is not malfunctioning and there are no breaks, short-circuits, grounds or similar in the cable 20, as shown in FIG. 2, the analog high level (Ry·Vc/(R1+Ry)) resulting from subtraction of the bias portion from the power supply voltage Vc is detected as the analog voltage Vadet when the A phase signal is at "H" level. And, when the A phase signal is at "L" level, the analog low level (R1·Vc/(R1+Rx)) resulting from addition of the bias portion to the ground voltage is detected.

Equations (1) and (2) similarly obtain for the analog voltage at the B phase signal terminal B.

Once again in FIG. 1, the analog signal SigAana of the A phase signal terminal A and the analog signal SigBana of the B phase signal terminal B are respectively input to the analog input portions 331A, 331B within the microcomputer 33, which is the processing unit within the control device 30. The output signals of the analog input portions 331A, 331B are converted into digital signals by the AD conversion portions 332A, 332B. And, in the following level anomaly detection portions 333A, 333B to which these digital signals are input, anomalies are detected by judging whether, as the analog voltage, the above-described analog high level or analog low level is detected. Details of the anomaly detection method are explained below.

In the above configuration, the analog input portions 331A, 331B, AD conversion portions 332A, 332B, and level anomaly detection portions 333A, 333B form a voltage level based device.

On the other hand, digital signal processing devices 31A, 31B in FIG. 1 are one type of AD conversion devices, which use a comparator or similar to compare the analog signal to a threshold value to create the digital signals SigA, SigB for the A phase and B phase, which are input to the microcomputer 33. And, the signal combining device 32 takes the exclusive logical sum of the digital signals SigA and SigB, and inputs the resulting combined signal SigAB to the microcomputer 33.

The digital signals SigA, SigB and the combined signal SigAB are respectively input to the digital input portions 334A, 334B, 337 within the microcomputer 33.

The output signals of the digital input portions 334A, 334B are input to the pulse number comparison anomaly detection portion 336 via the counters 335A, 335B, and anomalies are detected by comparing the numbers of pulses of the digital signals SigA and SigB.

The output signal of the digital input portion 337 is input to the pulse width comparison anomaly detection portion 339 via the timer 338, and anomalies are detected based on the pulse width (or period) of the "H" level combined signal SigAB.

In the above configuration, the digital input portions 334A, 334B, counters 335A, 335B, and pulse number comparison anomaly detection portion 336 form the pulse number based device, and the signal combining device 32, digital input portion 337, timer 338, and pulse width comparison anomaly detection portion 339 form the pulse width based device.

Figure 3:
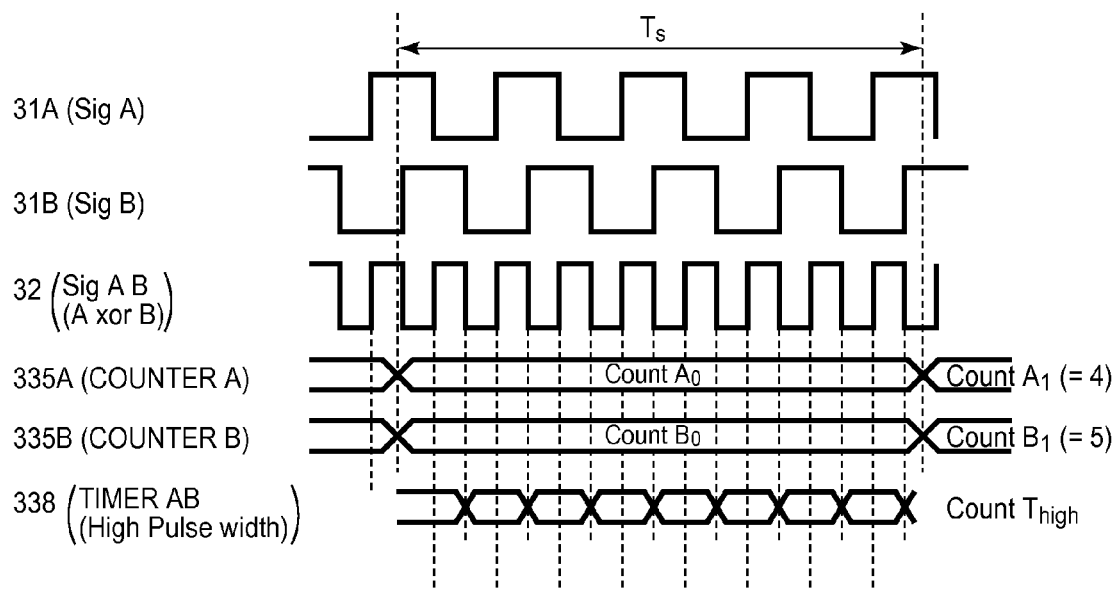
FIG. 3 is a timing chart showing output signals of each portion during normal operation in FIG. 1.

Next, FIG. 3 is a timing chart showing, for normal operation, output signals of the digital signal processing devices 31A, 31B (digital signals SigA, SigB), output signals of the signal combination device 32 (combined signal SigAB), and output signals of the counters 335A, 335B and timer 338. The control period Ts denotes the constant processing period of the microprocessor 33.

The A phase counter 335A counts the number of rising edges of the digital signal SigA detected in a control period Ts, and stores the count value in internal memory for each control period Ts. In FIG. 3, the previous count value CountA0 and the count value CountA1 measured during the current control period Ts are shown. In this example, the rising edge of the digital signal SigA was detected four times in the control period Ts, so that the count value is 4.

Also, the B phase counter 335B counts the number of rising edges of the digital signal SigB detected in a control period Ts, and stores the count value in internal memory for each control period Ts. In FIG. 3, the previous count value CountB0 and the count value CountB1 measured during the current control period Ts are shown. In this example, the rising edge of the digital signal SigB was detected five times in the control period Ts, so that the count value is 5.

The timer 338 measures the width of the "H" level of the combined signal SigAB. Two channels are provided in the timer 338, and the width of the "H" level and the width of the "L" level of the combined signal SigAB can each be measured, and can be compared. In the example of FIG. 3, each time the combined signal SigAB changes from "H" level to "L" level, the measured "H" level width is stored in internal memory as a count value CountThigh.

Next, the anomaly detection methods of this embodiment are explained.

First, an anomaly detection method is explained in detail in which, by monitoring the voltage level of analog signals input to the microcomputer 33, anomaly detection is possible even when the motor output shaft or other rotation member is stopped.

Figure 4A:
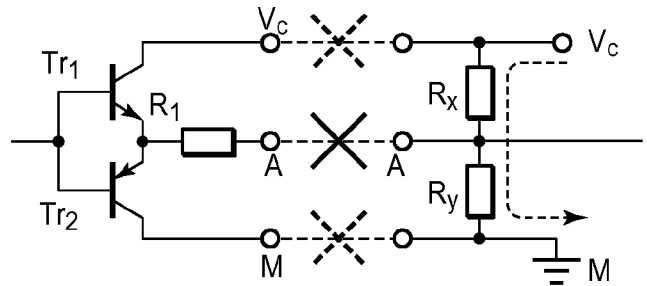
FIG. 4A explains voltage levels of analog signals during anomalies.
Figure 4B:
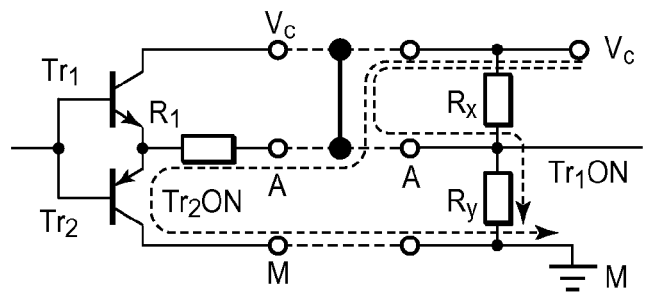
FIG. 4B explains voltage levels of analog signals during anomalies.
Figure 4C:
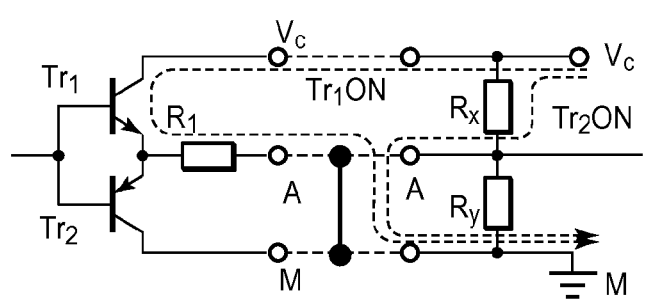
FIG. 4C explains voltage levels of analog signals during anomalies.

FIG. 4A through FIG. 4C are figures used to explain voltage levels of the A phase analog signal SigAana at the time of an anomaly. The following explanation similarly applies to the voltage level of the B phase analog signal SigBana.

FIG. 4A shows a case in which there is a break in the cable 20 (power supply line, signal line, or ground line); FIG. 4B shows a case in which the A phase signal line is short-circuited to the power supply line (power supply voltage Vc); and FIG. 4C shows a case in which the A phase signal line is short-circuited to the ground line (that is, grounded).

At the time of the cable break of FIG. 4A, when the transistors Tr1, Tr2 are not turned on because the rotation member is stopped or for another reason, current flows only in the voltage-dividing resistors Rx and Ry, regardless of whether the break is in a power supply line, a signal line, or a ground line. For this reason, the voltage Vadet of the analog signal SigAana is as given by equation (3). When the transistor Tr1 or the transistor Tr2 is turned on, the voltage should be as given by equation (1) or equation (2) above.

$$V_{adet} = \frac{R_y}{R_x + R_y} V_c \qquad (3)$$

That is, due to the cable break, the analog voltage Vadet is at a level intermediate between those of equations (1) and (2). Hence by setting a lower limit to the voltage on the right side in equation (1) and also setting an upper limit to the voltage on the right side in equation (2), and by having the level anomaly detection portions 333A, 333B in FIG. 1 detect the value of the analog voltage Vadet between the lower limit and upper limit, it is possible to judge that a break in the cable 20 has occurred.

Next, when the A phase signal line and the power supply are short-circuited as shown in FIG. 4B, if the transistor Tr1 is turned on, current does not flow in the voltage-dividing resistor Rx, and the current passes through the short-circuit path, so that the power supply voltage Vc is not divided. And if the transistor Tr2 is turned on, current similarly does not flow in the voltage-dividing resistor Rx, so that the power supply voltage Vc is not divided. Hence regardless of whether the rotation member is rotating or stopped, the analog voltage Vadet is expressed by equation (4).

$$Vadet=Vc \qquad (4)$$

That is, when there is a short-circuit, a voltage higher than the voltage on the right-hand side of equation (1) is detected as the analog voltage Vadet, so that if an upper limit is set in advance for the voltage on the right-hand side in equation (1), if the level anomaly detection portions 333A, 333B detect an analog voltage Vadet higher than this upper limit, it is possible to judge that there is a short circuit between a signal line and the power supply.

When there is the grounding shown in FIG. 4C, if the transistor Tr1 is turned on current does not flow in the voltage-dividing resistor Ry, and the current passes through the short-circuit path, so that the power supply voltage Vc is not divided. And if the transistor Tr2 is turned on also, current similarly does not flow in the voltage-dividing resistor Ry, so that the power supply voltage Vc is not divided. Hence regardless of whether the rotation member is rotating or stopped, the analog voltage Vadet is expressed by equation (5).

$$Vadet=0 \quad (5)$$

That is, when there is grounding, a voltage lower than the voltage on the right-hand side of equation (2) is detected as the analog voltage Vadet, so that by setting in advance a lower limit for the voltage on the right-hand side of equation (2), when the level anomaly detection portions 333A, 333B detect an analog voltage Vadet lower than this lower limit, it is possible to judge that a signal line is grounded.

As explained above, in the embodiment as shown in FIG. 1, by detecting the voltage level of analog input signals, the level anomaly detection portions 333A, 333B can detect anomalies (breaks in the cable 20, short-circuits of signal lines with power supply lines, grounding, and similar) when the rotation member is stopped. And, even when the rotation member is rotating, short-circuits of signal lines with power supply lines and grounding can be detected.

When the same phenomena as breaks in the cable 20, short-circuits, grounding and similar occur within the encoder 10, or occur on the input side of the microcomputer 33 within the control device 30, anomaly detection is similarly possible.

Next, an anomaly detection method is explained in detail in which, by monitoring digital signals input to the microcomputer 33, anomalies occurring while the rotation member is rotating are detected.

Figure 5:
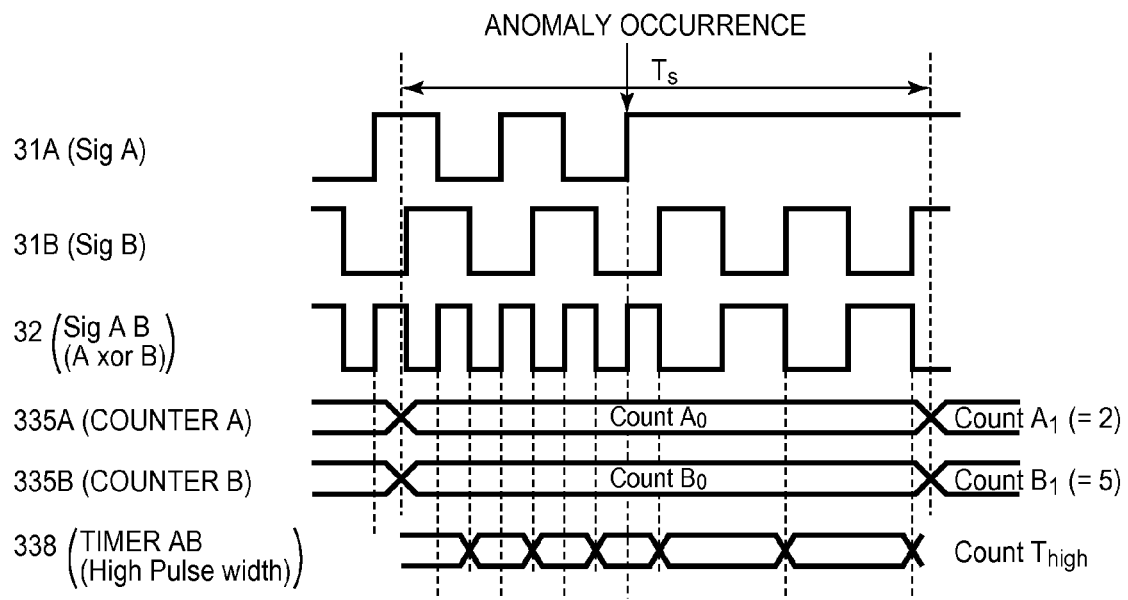
FIG. 5 is a timing chart showing output signals of each portion during anomalies in FIG. 1.

FIG. 5 is a timing chart showing output signals of each portion when an anomaly has occurred in the A phase digital signal SigA (the output signal of the digital signal processing device 31A). The following explanation similarly applies to anomalies in the B phase digital signal SigB.

First, when due to short-circuiting of the A phase signal line to the power supply line or for some other reason the A phase digital signal SigA is fixed at "H" level, the number of pulses output from the A phase counter 335A in FIG. 1 decreases, and an error with the number of pulses output from the B phase counter 335B occurs. Hence the pulse number comparison anomaly detection portion 336 in FIG. 1 compares the count values CountA1, CountB1 of the two counters 335A, 335B at each control period Ts, and judges that an anomaly has occurred when the difference becomes larger than a prescribed threshold value.

An error of approximately ±1 occurs between the two count values even during normal operation, depending on the timing of the control period Ts, and so it is desirable that the threshold value be a value greater than 2. In the example of FIG. 5, the count value CountA1 is 2, and the count value CountB1 is 5, so that by for example setting a threshold value of 2, an anomaly can be detected.

Apart from short-circuits between a signal line and a power supply line, when a digital signal is fixed at "L" level due to a cable break, grounding or other cause also, anomaly detection is possible based on a similar principle.

Figure 6:
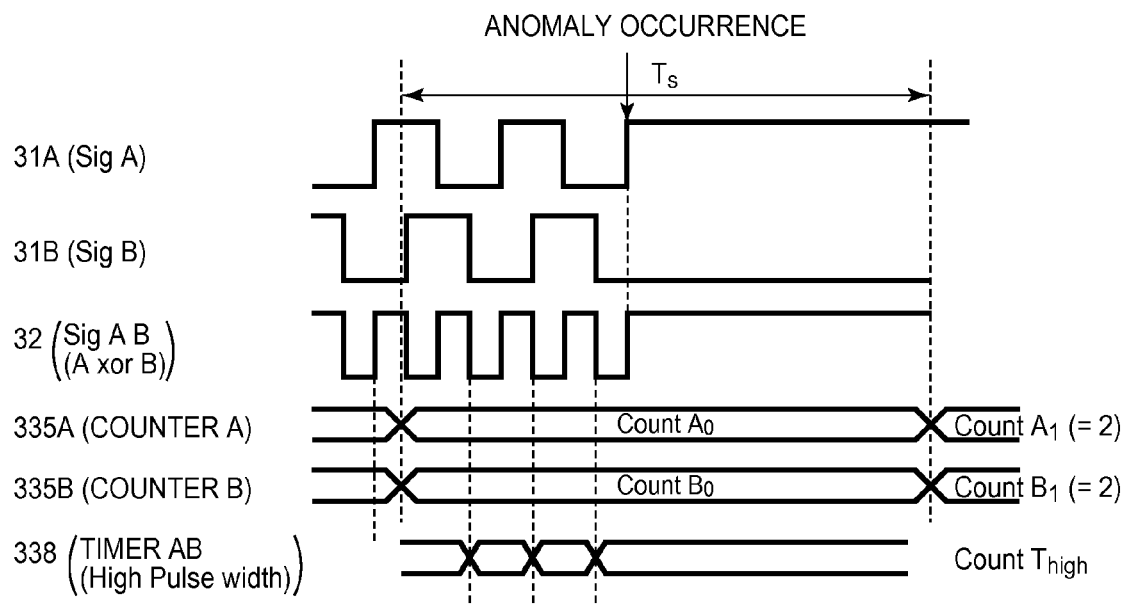
FIG. 6 is a timing chart showing output signals of each portion during anomalies in FIG. 1.

FIG. 6 shows operation in a case in which an anomaly has occurred in both the A phase digital signal SigA and in the B phase digital signal SigB.

In the example of FIG. 6, the count values CountA1 and CountB1 are both 2, so that an anomaly cannot be detected by either the pulse number comparison anomaly detection portion 336 or by the second conventional technology.

In this case, in the first embodiment as shown in FIG. 1, the combined signal (output signal of the signal combining device 32) SigAB, which is the exclusive logical sum of the digital signals SigA and SigB, is fixed at "H" level without change as shown in FIG. 6, so that the timer 338 which measures the width of the "H" level is no longer updated. Hence if the pulse width comparison anomaly detection portion 339 of FIG. 1 compares the current timer value (pulse width) with the timer value in the preceding control period Ts, or detects overflow of the period measurement timer, or executes similar processing, the fact that anomalies have occurred in both of the digital signals SigA and SigB can easily be detected.

Figure 7:
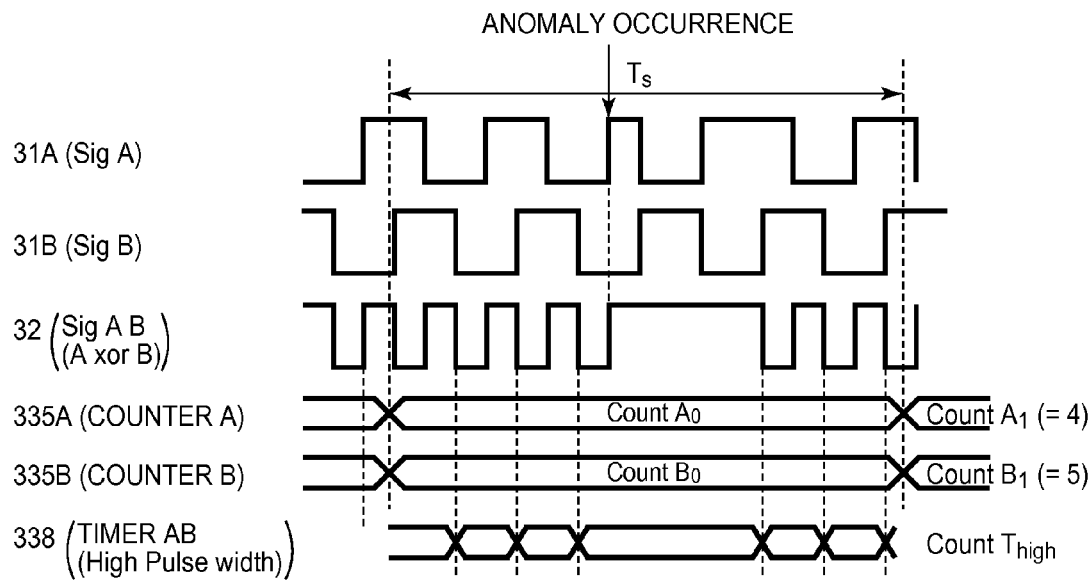
FIG. 7 is a timing chart showing output signals of each portion during anomalies in FIG. 1.

FIG. 7 shows a case in which an anomaly has occurred in the phase of the A phase digital signal SigA. Such a phase anomaly in the A phase digital signal SigA could conceivably occur, for example, in cases of a partial short-circuit of the A phase side with the B phase side, or when the transistors Tr1, Tr2 in the encoder 10 malfunction.

In such a case, for example when using the second conventional technology, there is no change in the number of pulses for each phase, and it appears that from a partial anomaly there has already been a transition to the normal state, so that anomaly detection is not possible.

On the other hand, in the first embodiment as shown in FIG. 1, the timer 338 is measuring the "H" level width of the combined signal SigAB, so that by comparing the current timer value with the timer value in the preceding control period Ts, and measuring the time difference, anomaly detection can be performed by simple means.

Figure 8:
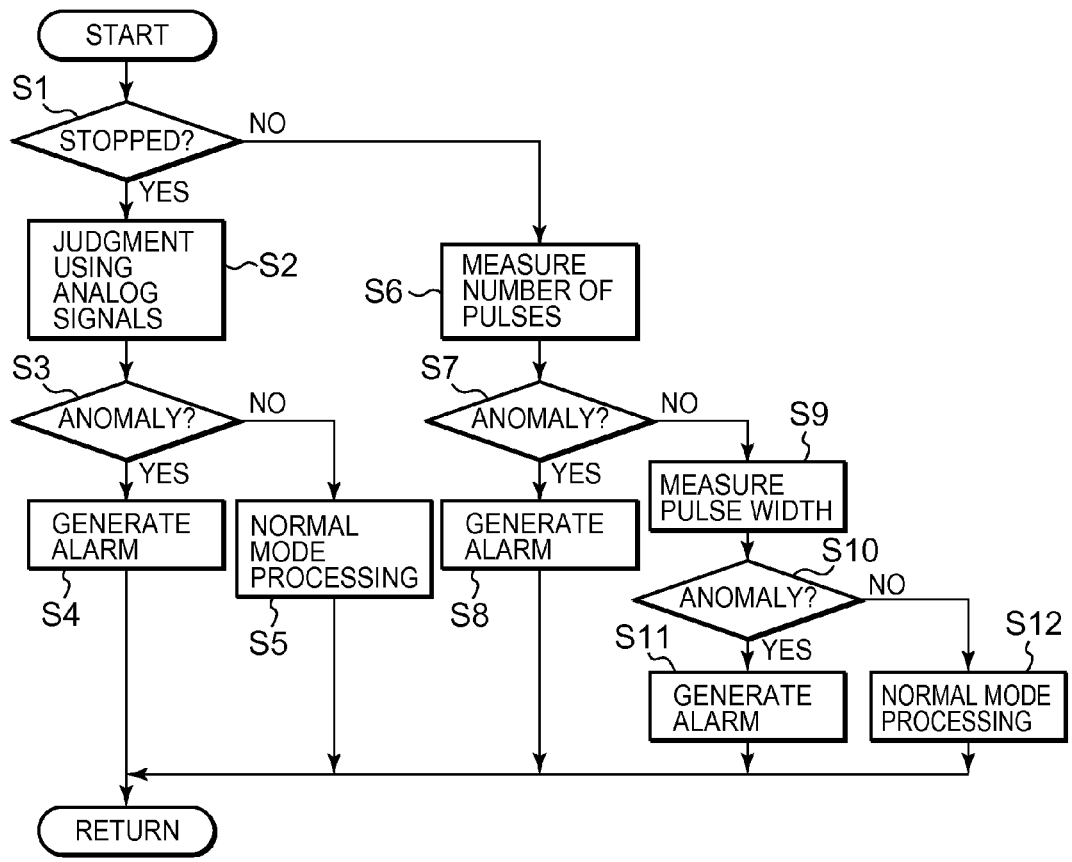
FIG. 8 is a flowchart showing anomaly detection processing in the first embodiment.

FIG. 8 shows the flowchart for the above-described anomaly judgment.

First, a judgment is made as to whether the rotation member is rotating or is stopped (step S1). For example, if the rotation member is the output shaft of a motor, when an encoder is used to detect the motor speed and rotation member position, whether the rotation member is rotating or is stopped can easily be judged by detecting whether or not one or more encoder output pulses is detected within a fixed time interval, or by referencing a motor speed instruction value, operation instruction flag, voltage instruction value, current detection value, or other information.

If the rotation member is stopped, then the voltage level of the analog signal can be used by the level anomaly detection portions 333A, 333B to judge anomalies, as described above, and whether an anomaly exists is judged according to whether the detected analog voltage Vadet is within a range of threshold values based on equation (1) and equation (2) (Yes in step S1, steps S2, S3).

If the rotation member is rotating, then the pulse number comparison anomaly detection portion 336 judges whether or not an anomaly exists according to whether the difference in the numbers of pulses has exceeded the threshold value (No in step S1, steps S6, S7). If the difference in the numbers of pulses has not exceeded the threshold value, the pulse width comparison anomaly detection portion 339 compares the timer value (pulse width) with the preceding value or similar, and judges whether an anomaly exists (No in step S7, steps S9, S10).

When in one of the above judgment steps an anomaly is judged to exist (Yes in step S3, or Yes in S7, or Yes in S10), operation of the rotation member, that is, the motor, is stopped, an anomaly detection signal is output to the outside as an alarm, or other processing upon anomaly occurrence is performed (steps S4, S8, S11). When no anomaly is judged to have occurred (No in step S3 or No in step S10), normal control is performed as normal mode processing, to continue operation (steps S5, S12).

As is clear from FIG. 3, pulse width measurements by the timer 338 are updated at each edge of the pulse (combined signal SigAB), so that redundant interrupt processing in the microcomputer 33 can be utilized, executing measurements on an interrupt level different from pulse count measurements. By this means, even when a phase anomaly occurs in only a portion of a control period Ts, the anomaly is not missed, and can be detected.

Figure 9:
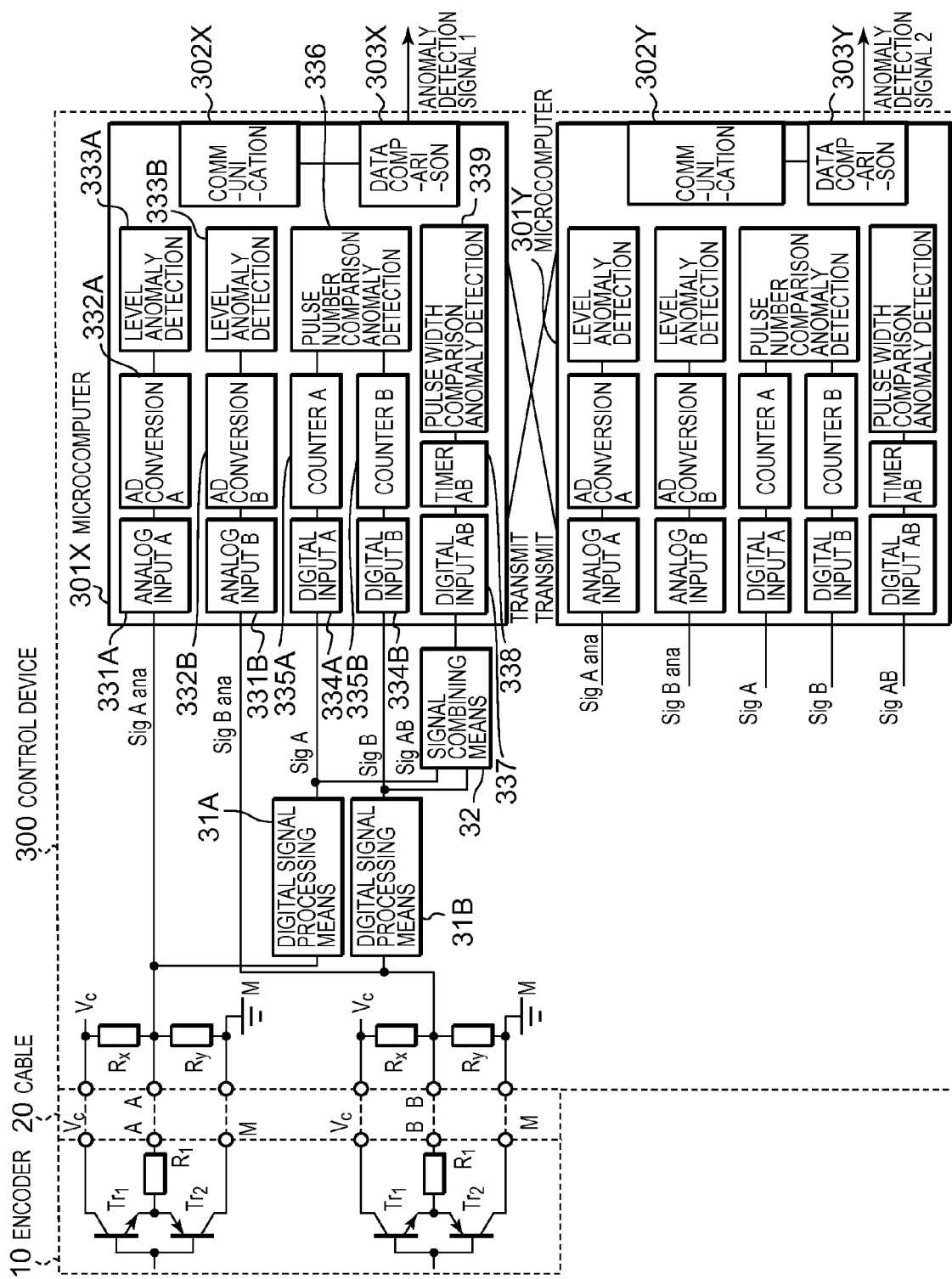
FIG. 9 is a circuit diagram showing a second embodiment of the invention.

Next, FIG. 9 is a circuit diagram showing a second embodiment of the invention.

The second embodiment differs from the first embodiment in that dual microcomputers are provided in the control device for reciprocal monitoring, so that the reliability of the anomaly monitoring device is improved. Constituent elements which are the same as in the first embodiment are assigned the same symbols, and explanations are omitted; the following explanation focuses mainly on different portions.

In FIG. 9, the control device 300 incorporates two microcomputers 301X, 301Y. Similarly to FIG. 1, these microcomputers 301X, 301Y each include a voltage level based device, including analog input portions 331A and 331B which process analog signals SigAana and SigBana, AD conversion portions 332A, 332B, and level anomaly detection portions 333A, 333B; a pulse based device, including digital input portions 334A and 334B which process digital input signals SigA and SigB, counters 335A and 335B, and a pulse number comparison anomaly detection portion 336; and a pulse width based device, including a digital input portion 337 which processes a combined signal SigAB created by the signal combining device 32, a timer 338, and a pulse width comparison anomaly detection portion 339. In FIG. 9, reference symbols are assigned only to the constituent elements in one of the microcomputers 301X.

Further, a communication device 302X and a data comparison device 303X are provided in one of the microcomputers 301X; and a communication device 302Y and a data comparison device 303Y are provided in the other microcomputer 301Y as well.

Here, the communication devices 302X, 302Y are provided for reciprocal transmission and reception of anomaly detection results, analog signal voltage levels, the number of pulses of digital signals, the "H" level pulse widths of combined signals, and other detection data of each of the microcomputers 301X, 301Y to the other microcomputer. And, the data comparison devices 303X, 303Y are provided to compare the detection data of the other microcomputer which has been received by the microcomputer, with the microcomputer's own detection data, and to output an anomaly detection signal 1 and anomaly detection signal 2 according to the result.

In the example of FIG. 9, the dual microcomputers 301X, 301Y are provided on the output side of the digital signal processing devices 31A, 31B and the signal combining device 32. However, although not shown, a dual configuration may be provided for the digital signal processing devices 31A, 31B and a signal combining device 32 on the input side of each of the microcomputers 301X, 301Y.

The mode of communication between the microcomputers 301X, 301Y may be either synchronous or asynchronous, and no limitations in particular are imposed.

Because anomaly detection operation by each of the microcomputers 301X, 301Y is similar to that in the first embodiment, a detailed description is here omitted.

However, in this embodiment the data received from the other microcomputer is compared by the data comparison devices 303X, 303Y with the microcomputer's own anomaly detection results, analog signal voltage levels, numbers of pulses of digital signals, and pulse widths, and when there are differences therebetween, and if the differences in voltage levels, numbers of pulses, and pulse widths exceed the prescribed threshold value, an anomaly detection signal 1 or anomaly detection signal 2 is output. By means of these anomaly detection signals, judgment can be made of wiring anomalies beyond the dual configuration, internal functions of microcomputers (AD conversion portion, counters, timers, and similar), or an anomaly of the communication system, so that by means of the anomaly detection signal 1 or anomaly detection signal 2, functions of the microcomputers 301X, 301Y can be judged.

The threshold values which are compared with voltage levels, numbers of pulses, and pulse width differences can be set freely; but because anomalies due to microcomputer functions dominate, it is desirable that values be set with sufficient margins so that there is no erroneous detection.

Here, of course the anomaly detection signal 1 and anomaly detection signal 2 may comprise the anomaly detection results of the level anomaly detection itself, of pulse number comparison anomaly detection, and of pulse width comparison anomaly detection.

In this way, by means of this embodiment it is possible to detect anomalies between the encoder and the microcomputer, as well as anomalies in the internal functions of a microcomputer, so that compared with the first embodiment, reliability of the anomaly monitoring device can be further improved.

Figure 10:
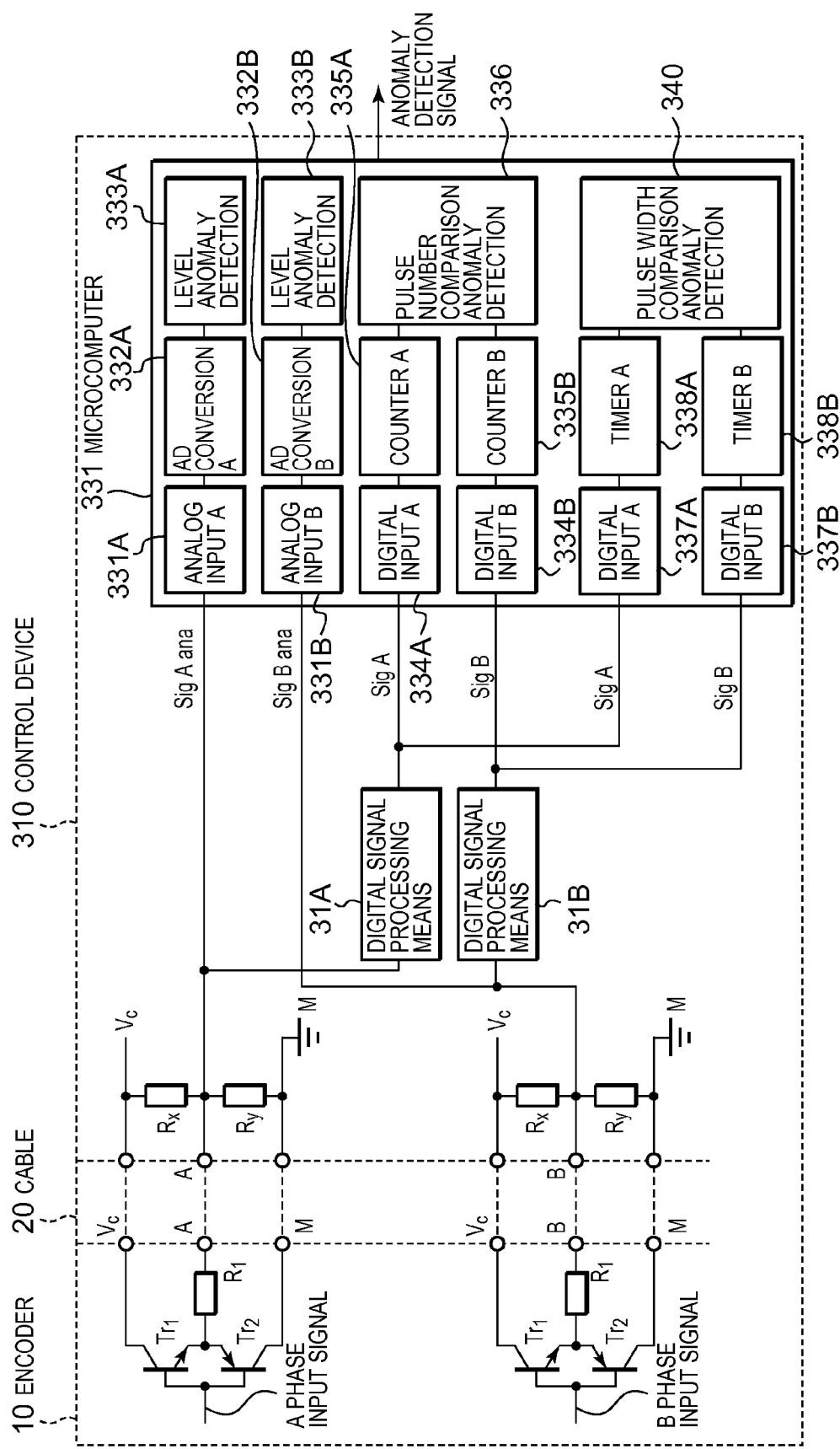
FIG. 10 is a circuit diagram showing a third embodiment of the invention.

Next, FIG. 10 is a circuit diagram showing a third embodiment of the invention.

In the above-described first and second embodiments, when the pulse width comparison anomaly detection portion 339 detects anomalies based on a timer value (pulse width), the signal combining device 32 must combine the A phase and B phase digital signals SigA, SigB, with different phases, to create the combined signal SigAB. However, as is clear from FIG. 3 and elsewhere, the "H" level pulse width of the combined signal SigAB is ½ the "H" level pulse widths of the original digital signals SigA and SigB. Hence when the rotation member rotates rapidly, the "H" level pulse width of the combined signal SigAB becomes short, and due to constraints on the microcomputer clock resolution, if the pulse width becomes shorter than the time intervals measured by the timer, measurement becomes impossible. In addition, in the first and second embodiments it is not possible to create the combined signal within the microcomputer, and an external logic circuit must be added to realize the signal combining device 32, resulting in an increase in cost.

Hence the third embodiment was devised in order to expand the range of speeds during anomaly detection, and also to further reduce costs.

Below, the circuit configuration of this third embodiment is explained. Constituent elements which are the same as in the first and second embodiments are assigned the same symbols, and explanations are omitted.

In FIG. 10, 310 is a control device; in this embodiment, the above-described signal combining device 32 is unnecessary, and the internal configuration of the microcomputer 311 differs from that of the above first and second embodiments. That is, the A phase and B phase digital signals SigA, SigB output from the digital signal processing devices 31A, 31B are respectively input to the digital input portions 337A, 337B in the microcomputer 311 without being combined. On the output side of the digital input portions 337A and 337B, the timers 338A, 338B, which measure the "H" level widths of the A phase and B phase digital signals SigA, SigB are respectively connected, and on the output side of the timers 338A and 338B, the pulse width comparison anomaly detection portion 340 is connected. Here, the pulse width comparison anomaly detection portion 340 compares the preceding values and current values of the timer values ("H" level widths of the digital signals SigA, SigB), or compares the A phase timer value with the B phase timer value, and detects an anomaly when these exceed a prescribed threshold value.

In the above configuration, the digital input portions 337A, 337B, timers 338A, 338B, and pulse width comparison anomaly detection portion 340 form the pulse width based device.

Next, operation of the third embodiment is explained. Because anomaly detection when the rotation member is stopped is based on analog signals, in the following, anomaly detection operation based on the A phase and B phase digital signals SigA, SigB during rotation of the rotation member is explained.

Figure 11:
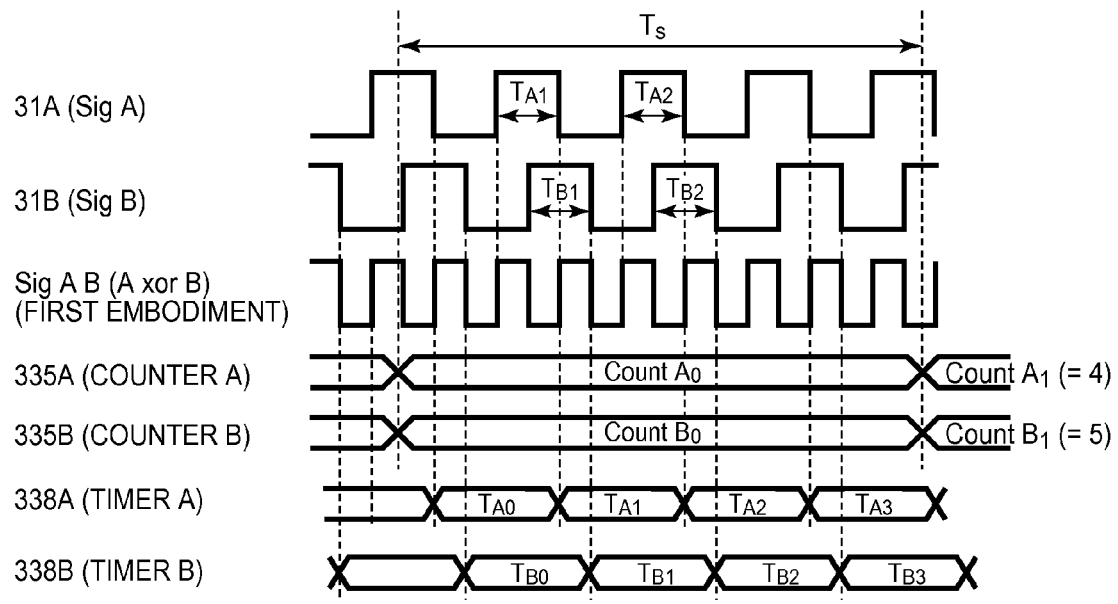
FIG. 11 is a timing chart showing output signals of each portion during normal operation in FIG. 10.

FIG. 11 is a timing chart showing the output signals during normal operation of the digital signal processing devices 31A, 31B, the counters 335A, 335B, and the timers 338A, 338B. For comparison, the output signal of the signal combining device 32 (combined signal SigAB) in the first embodiment is also shown.

Operation of the counters 335A, 335B in FIG. 11 is the same as in FIG. 3, and so operation of the timers 338A, 338B is explained.

The timer 338A starts operation at the rising edge of the A phase digital signal SigA, and by saving the timer value at the falling edge, measures the "H" level width of the A phase digital signal SigA through this timer value. Similarly, the timer 338B starts operation at the rising edge of the B phase digital signal SigB, and by saving the timer value at the falling edge, measures the "H" level width of the B phase digital signal SigB through this timer value. In FIG. 11, TA0, TA1, . . . , TB0, TB1, . . . , denote timer values (the "H" level widths of the digital signals SigA, SigB).

The pulse width comparison anomaly detection portion 340 compares the respective preceding and current timer values for the A phase and B phase, and in the example of FIG. 11, judges that operation is normal based on the fact that the preceding values and the current values are equal.

Figure 12:
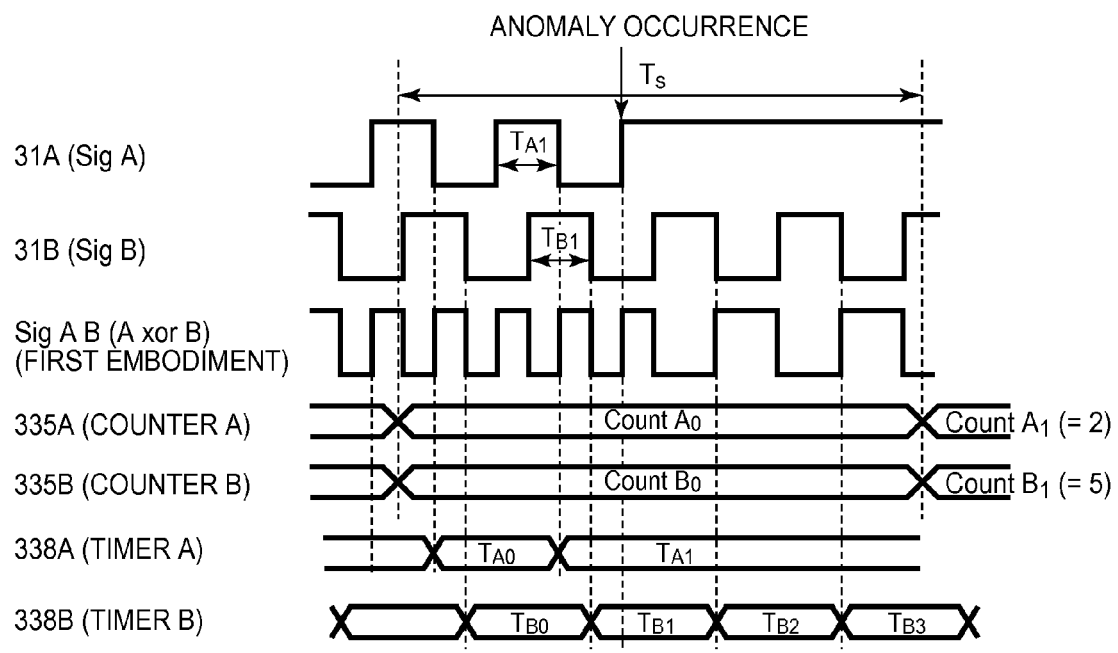
FIG. 12 is a timing chart showing output signals of each portion during anomalies in FIG. 10.

FIG. 12 is a timing chart for a case in which an anomaly has occurred in the A phase digital signal SigA. If, due to short-circuiting of the A phase signal line with the power supply line or for some other reason, the A phase digital signal SigA is fixed at "H" level, when the difference between the count values CountA1, CountB1 of the counters 335A, 335B becomes larger than a prescribed threshold value (for example, 2), then an anomaly is judged to have occurred, similarly to FIG. 5 above. In cases in which the A phase digital signal SigA is fixed at "L" level due to a cable break, grounding or similar, as well as cases in which an anomaly occurs in the B phase digital signal SigB, anomaly detection is possible based on a similar principle.

Figure 13:
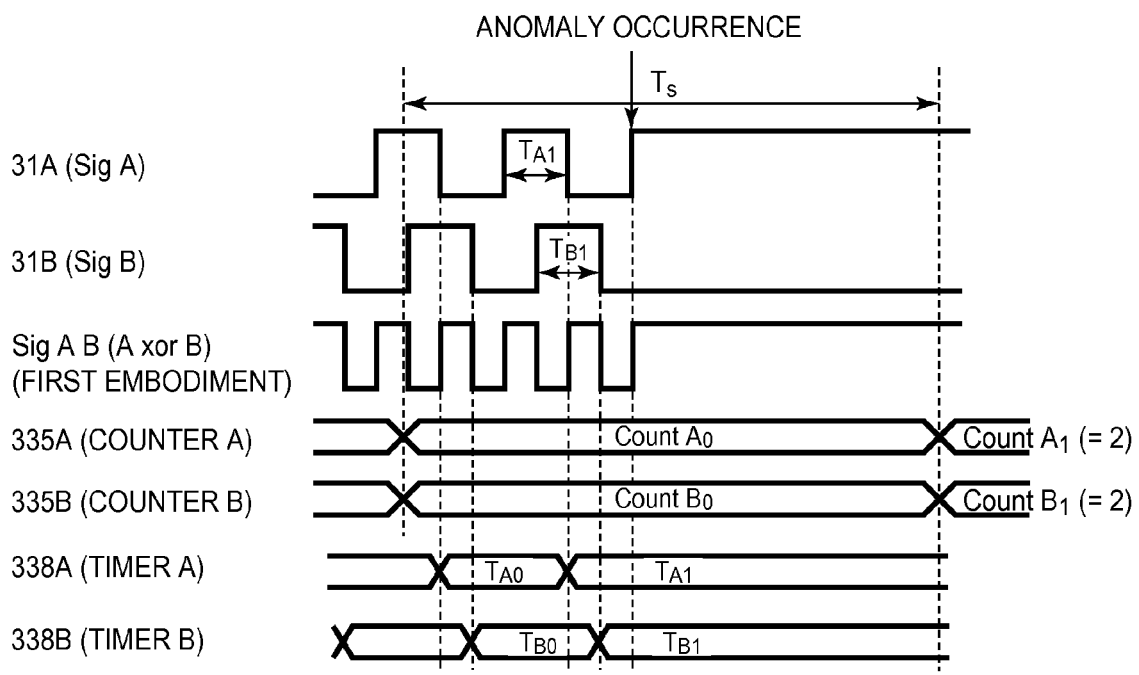
FIG. 13 is a timing chart showing output signals of each portion during anomalies in FIG. 10.

FIG. 13 is a timing chart for a case in which anomalies have occurred in both the A phase and the B phase digital signals SigA, SigB.

In this case, in the example of FIG. 13 the count values CountA1, CountB1 are both 2, so that the pulse number comparison anomaly detection portion 336 cannot detect an anomaly. Hence in this embodiment, the preceding values and current values of the A phase and B phase timers are respectively compared.

That is, in FIG. 13, the "H" level widths for the digital signals SigA, SigB (that is, the timer values) TA1, TB1 are measured immediately before the occurrence of the anomaly for both the A phase and the B phase, but due to the anomaly occurrence, the falling edges of the digital signals SigA, SigB needed to save the timer values do not appear, so that after the anomaly occurrence the timer values are added for both the A phase and the B phase. Hence if the timer values TA1, TB1 currently being added for the A phase and B phase are compared with the preceding timer values TA0, TB0 with prescribed timing, large differences appear between TA1 and TA0, and between TB1 and TB0, so that when these differences exceed the prescribed threshold value, anomaly occurrence is detected for both the A phase and the B phase digital signals SigA, SigB.

Figure 14:
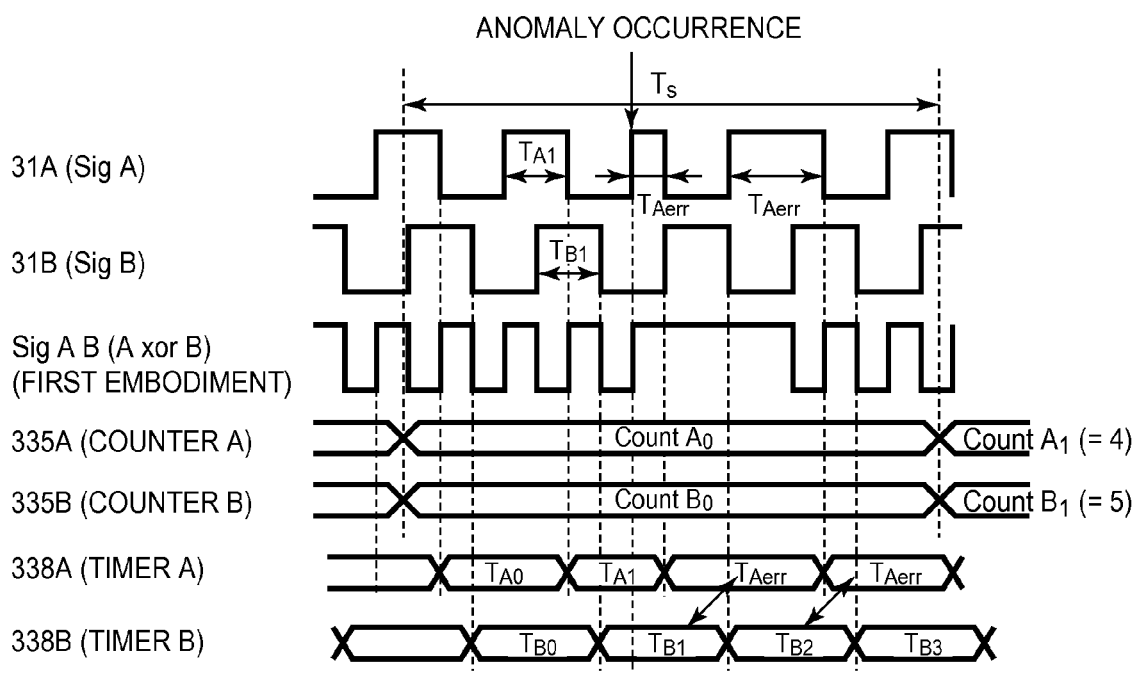
FIG. 14 is a timing chart showing output signals of each portion during anomalies in FIG. 10.

FIG. 14 is a timing chart for a case in which an anomaly has occurred in the phase of the A phase digital signal SigA. As explained in FIG. 7, such a phase anomaly arises from partial short-circuits between the A phase side and the B phase side, malfunctions of the transistors Tr1, Tr2 in the encoder 10, or for other reasons.

In this case, the differences in the number of pulses of the A phase and B phase digital signals SigA, SigB are not equal to or greater than the threshold value (for example, 2), but there is a difference between the timer value for the A phase, which has an anomaly, and the timer value of the B phase, which is normal; that is, differences occur between TAerr1 and TB1, and between TAerr2 and TB2. Further, a difference also occurs between for example the current timer value TAerr1 and the preceding timer value TA1 of the A phase digital signal SigA.

Hence in this embodiment, the pulse width comparison anomaly detection portion 340 detects the anomaly of the A phase digital signal SigA based on the difference between the timer values TAerr1 and TB1, or the difference between the timer values TAerr2 and TB2, or the difference between the timer values TAerr1 and TA1.

The anomalies appearing in FIG. 13 and FIG. 14 can also be detected by the first embodiment, for example; but in the third embodiment, the "H" level widths of the A phase and B phase digital signals SigA, SigB are measured, and these widths are twice the "H" level width of the combined signal SigAB, which is the object of measurement in the first embodiment. Hence when using a microcomputer with the same clock frequency, rotation speeds up to twice as fast as in the first embodiment can be measured, so that the range of speeds can be expanded.

Further, by means of the third embodiment, there is no need for the logic circuit used as a signal combining device 32 in the first and second embodiments, and the simplified circuit configuration makes possible smaller size and reduced cost.

The flowchart for anomaly judgment in the third embodiment is basically similar to that in FIG. 8 described above, but a difference is that in the third embodiment, a combined signal SigAB is not being measured in the pulse width measurement step (S9) and anomaly judgment step (S10) of FIG. 8; instead, the "H" level widths of the A phase and B phase digital signals SigA, SigB are measured separately to perform anomaly judgment.

Figure 15:
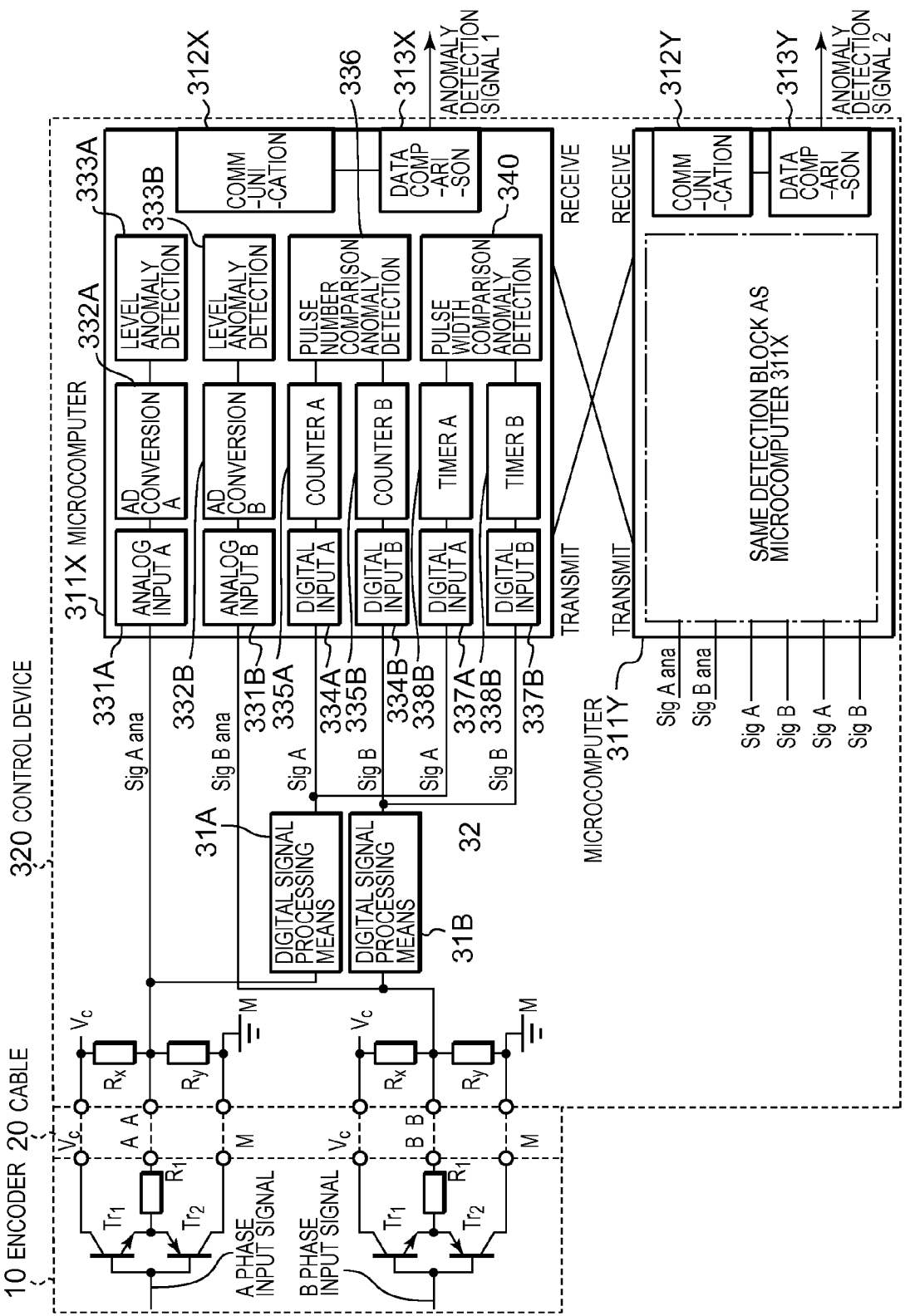
FIG. 15 is a circuit diagram showing a fourth embodiment of the invention.

Next, FIG. 15 is the circuit diagram of a fourth embodiment of the invention. In the fourth embodiment, two microcomputers are provided in the control device of the third embodiment, enabling reciprocal monitoring.

That is, in FIG. 15 the control device 320 includes two microcomputers 311X, 311Y. These microcomputers 311X, 311Y each include the same detection block as the microcomputer 311 shown in FIG. 10 (including analog input portions 331A, 331B, AD conversion portions 332A, 332B, level anomaly detection portions 333A, 333B, digital input portions 334A, 334B, counters 335A, 335B, pulse number comparison anomaly detection portion 336, digital input portions 337A, 337B, timers 338A, 338B, and a pulse width comparison anomaly detection portion 340). Further, one of the microcomputers 311X includes a communication device 312X and a data comparison device 313X, and the other microcomputer 311Y also includes a communication device 312Y and a data comparison device 313Y.

The communication devices 312X, 312Y are provided for reciprocal transmission and reception of anomaly detection results, analog signal voltage levels, the number of pulses of digital signals, the "H" level pulse widths of combined signals, and other detection data of each of the microcomputers 311X, 311Y to the other microcomputer. And, the data comparison devices 313X, 313Y are provided to compare the detection data of the other microcomputer which has been received by the microcomputer, with the microcomputer's own detection data, and to output an anomaly detection signal 1 and anomaly detection signal 2 according to the result.

The position for dual configuration of the two microcomputers 311X, 311Y, and the mode of communication between the microcomputers 311X, 311Y, can be selected arbitrarily, similarly to the second embodiment of FIG. 9.

In this embodiment also, the data comparison devices 313X, 313Y compare data received by the communication devices 312X, 312Y from the other microcomputer with their own anomaly detection results, with the voltage levels of analog signals, with the number of pulses of digital signals, and with pulse widths. And, when there are differences between these data, and when the differences between the voltage levels, numbers of pulses, and pulse widths exceed prescribed threshold values, an anomaly detection signal 1 or anomaly detection signal 2 is output. By this means, the functions of the microcomputers 311X, 311Y can be diagnosed.

Here, the anomaly detection signal 1 and anomaly detection signal 2 may include the anomaly detection results of the level anomaly detection itself, of pulse number comparison anomaly detection, and of pulse width comparison anomaly detection.

By means of this embodiment it is possible to detect anomalies between the encoder and the microcomputer, as well as anomalies in the internal functions of a microcomputer, so that compared with the third embodiment, reliability of the anomaly monitoring device can be further improved.

Next, a fifth embodiment of the invention is explained. This embodiment is an improvement of the third embodiment explained using FIG. 10.

In the third embodiment shown in FIG. 10, the encoder 10 is assumed to be a complementary-type device including transistors Tr1, Tr2, and a differential-output type (line driver type) encoder is not addressed. Here, a line driver type is a device which outputs, for each phase, a set of differential signals including a signal A and the inverted signal A−; on the side of the receiver receiving these differential signals, by converting these differential signals A, A− into logic levels conforming to a reference potential, there is the advantage that a system which is not easily affected by fluctuations of the common-mode potential and other factors, and which is robust with respect to noise, can be constructed.

Moreover, when a line driver type encoder is applied without modification to the control device 310 of the third embodiment, the following problems occur.

(1) Because the encoder output signals are differential signals, twice the number of AD conversion portions per phase are required compared with complementary-type devices. In this case, if the number of channels in the microcomputer or other device is inadequate, further AD conversion portions must be added, increasing the device space and cost.

(2) As a means of addressing (1) above, when reducing the number of AD conversion portions by performing AD conversion of line receiver output signals after converting to a logic level conforming to the reference potential, it is not possible to detect an anomaly when only one of the two differential signal lines per phase breaks. This is because, as explained above, at the time of a line break an intermediate voltage level is detected, but this voltage level is fixed at either high level or low level due to the threshold level of the line receiver differential signal, so that even when there is a line break, operation is erroneously regarded as normal.

Hence in the fifth embodiment of the invention, an anomaly monitoring device is provided which is capable of detecting anomalies with high precision without entailing increases in space or cost, even when a line driver type encoder is used.

Below, the fifth embodiment of the invention is explained referring to the drawings.

Figure 16:
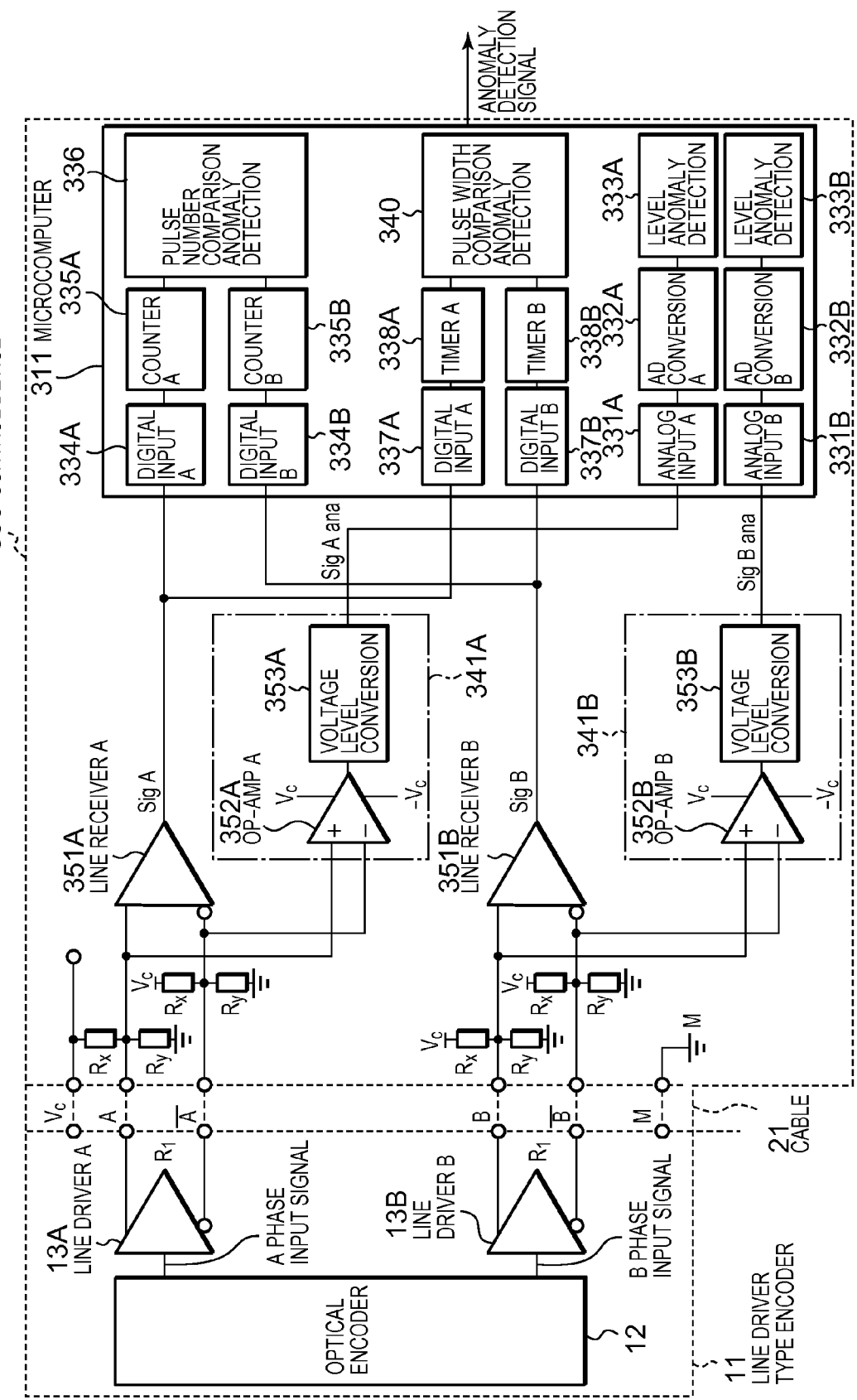
FIG. 16 is a circuit diagram showing a fifth embodiment of the invention.

FIG. 16 is a circuit diagram showing the fifth embodiment. In this fifth embodiment, the configuration of the microcomputer 311 within the control device 350 is the same as the microcomputer 311 of the third embodiment in FIG. 10; a difference is means for generating the A phase and B phase digital signals SigA, SigB and the A phase and B phase analog signals SigAana, SigBana, which are input to the microcomputer 311, and this is mainly explained below.

In FIG. 16, 11 is a line driver type encoder; an A phase input signal and B phase input signal, with phase differing by 90°, are output from an optical encoder 12 provided on the motor output shaft or similar. These signals are input to the A phase and B phase line drivers 13A, 13B, and for each, a set of differential signals A, A− and B, B− is generated. In FIG. 16, the superscript "−" is appended to the symbols A, B to indicate the inverted signals A−, B−.

The differential signals A, A− and B, B− are input to the control device 350 via the cable 21.

In the control device 350, the differential signals A, A− and B, B− are input to the A phase line receiver 351A and B phase line receiver 351B, via the connection point of voltage-dividing resistors Rx, Ry connected between the power supply terminal Vc (the power supply voltage is also denoted by Vc) and the ground terminal M.

The line receivers 351A, 351B convert the A phase and B phase input signals into A phase and B phase digital signals SigA, SigB, and these digital signals are input to the digital input portions 334A, 337A, 334B, 337B within the microcomputer 311. Processing subsequent to these digital input portions 334A, 337A, 334B, 337B is similar to that of the third embodiment in FIG. 10, and anomalies are detected during rotation of the rotation member by the pulse number comparison anomaly detection portion 336 and the pulse width comparison anomaly detection portion 340.

On the other hand, the differential signals A, A− and B, B− are respectively input to the positive input terminals and negative input terminals of A and B phase op-amps 352A, 352B, as a positive/negative power supply type (with Vc and −Vc power supply voltages) analog operation device. The op-amps 352A, 352B include amplification resistors and feedback resistors, by means of which the gain is determined; however, to simplify the explanation, these resistors are not shown, and the explanation assumes that the op-amps 352A, 352B are differential amplification circuits with a gain of unity.

The analog output signals of the op-amps 352A, 352B are respectively input to the voltage level conversion devices 353A, 353B. The voltage level conversion devices 353A, 353B have functions to add a voltage equal to approximately ½ the power supply voltage Vc to the analog output signals of the op-amps 352A, 352B, and to change the gain and adjust the input voltage levels to the AD conversion portions 332A, 332B within the microcomputer 311 so that the power supply voltage Vc is not exceeded. This is because the AD conversion portions 332A, 332B within the microcomputer 311 cannot handle voltages having positive and negative polarities.

Here, an A phase voltage level measurement device 341A is formed by the op-amp 352A and a voltage level conversion device 353A, and a B phase voltage level measurement device 341B is formed by the op-amp 352B and voltage level conversion device 353B.

In FIG. 16, the line receivers 351A, 351B, digital input portions 334A, 334B, counters 335A, 335B, and pulse number comparison anomaly detection portion 336 form the voltage level based device.

And, the line receivers 351A, 351B, digital input portions 337A, 337B, timers 338A, 338B, and pulse width comparison anomaly detection portion 340 form the pulse number based device.

Further, the voltage level measurement devices 341A, 341B, analog input portions 331A, 331B, AD conversion portions 332A, 332B, and level anomaly detection portions 333A, 333B form the pulse width based device.

Figure 17A:
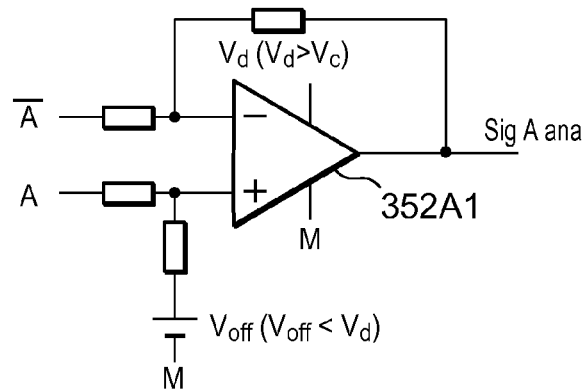
FIGS. 17A-17E are a circuit diagram (FIG. 17A) and diagrams (FIGS. 17B-17E) explaining operation of a modified example of the voltage level measurement device in FIG. 16.

The voltage level measurement devices 341A and 341B, including the op-amps 352A, 352B and voltage level conversion devices 353A, 353B, can also be configured by means of the circuit of FIG. 17A.

That is, for example in the case of the A phase, a single-power supply type op-amp (with power supply voltage Vd) 352A1 and an offset voltage Voff may be combined and used. In this case, by using two voltage levels, which are the positive power supply voltage Vd above Vc and the offset voltage Voff below Vd (for example, approximately ½ of Vd), a negative power supply can be omitted, and action similar to that of the voltage level measurement device 341A of FIG. 16 can be achieved.

Figure 17B:
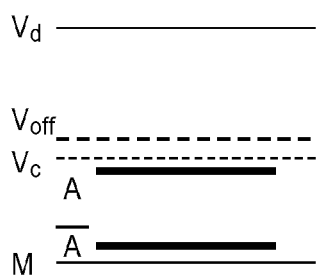
Figure 17C:
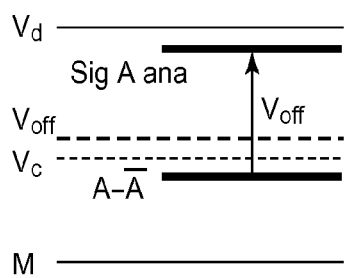
Figure 17D:
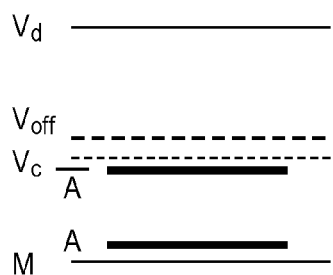
Figure 17E:
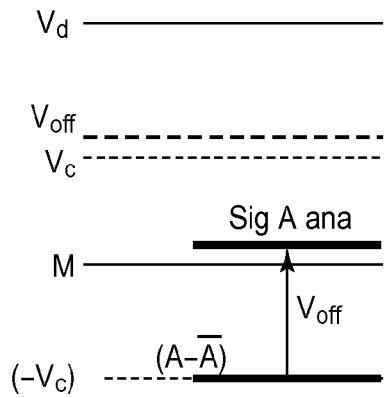

FIG. 17C shows A phase analog signals SigAna according to the logic of the differential signals A, A− shown in FIG. 17B; FIG. 17E shows A phase analog signals SigAna according to the logic of the differential signals A, A− shown in FIG. 17D; a prescribed voltage level can be detected similarly to the case in which a dual power-supply type op-amp is used.

Although not shown, a single-power supply type op-amp and offset voltage can be used for the B phase, similarly to FIG. 17A, to obtain an analog signal SigBana.

Next, anomaly detection operation while the rotation member is stopped, using the A phase and B phase analog signals SigAana and SigBana, is explained. In the following, detection for the A phase is explained, but the operation is the same for the B phase.

Figure 18A:
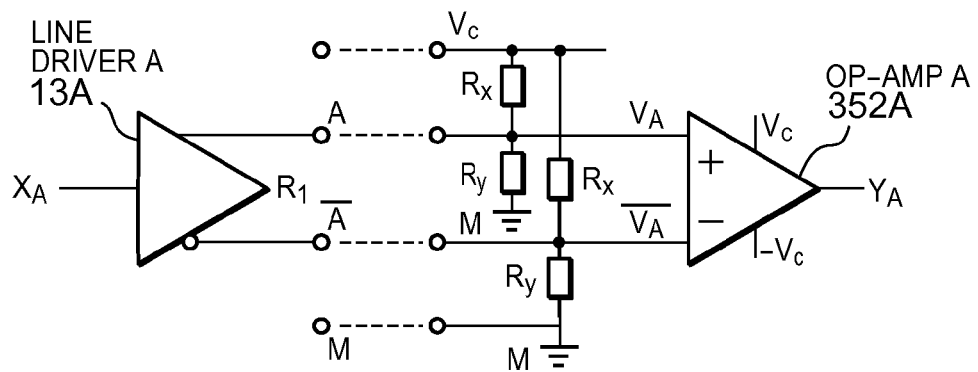
FIGS. 18A-18B are a circuit diagram (FIG. 18A) and a diagram (FIG. 18B) explaining operation during normal operation in the fifth embodiment.
Figure 18B:
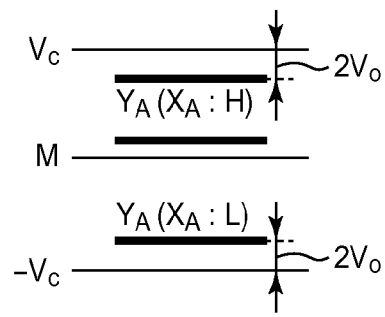

First, FIG. 18A and FIG. 18B explain operation when no anomalies are present; FIG. 18A shows the circuit from the line driver 13A to the op-amp 352A, and FIG. 18B shows the level of the output signal YA of the op-amp 352A. As shown in FIG. 18A, the A phase signal input to the line driver 13A from the optical encoder 12 of FIG. 16 is XA.

The line driver 13A is configured by combining FETs or other semiconductor elements; when the A phase input signal XA is at "H" level, the differential signal A is at the level of the power supply voltage Vc, and the differential signal A− is at the level of the ground terminal M (ground potential); when the A phase input signal XA is at "L" level, the differential signal A is at the level of the ground terminal M, and the differential signal A− is at the level of the power supply voltage Vc. Due to the on voltage drops across semiconductor elements and the wire resistance of the cable, when the A phase input signal XA is at "H" level the output voltage is reduced, and when the A phase input signal XA is at "L" level the output voltage is increased.

When the error voltage due to semiconductor element turn-on voltage drops and cable wire resistances is V0, and if it is assumed that this error voltage occurs in both the differential signals A and A−, then the input signals VA, VA− of the op-amp 352A when the A phase input signal XA is at "H" level are given by equation (6).

In this Specification, the inverted signal of VA is denoted by VA−, and in FIG. 18A and below, the superscript "−" is appended to the symbol VA to denote an inverted signal.

$$VA = Vc - V0$$

$$VA- = M + V0 \qquad (6)$$

(M Denotes the Ground Potential.)

Hence, as indicated in FIG. 18B, the output signal YA of the op-amp 352A is given by equation (7).

$$YA = VA - VA- = Vc - 2V0 \qquad (7)$$

And, the input signals VA, VA− to the op-amp 352A when the A phase input signal XA is at "L" level are given by equation (8).

$$VA = M + V0$$

$$VA- = Vc - V0 \qquad (8)$$

Hence, as indicated in FIG. 18B, the output signal YA of the op-amp 352A is given by equation (9).

$$YA = VA - VA- = -Vc + 2V0 \qquad (9)$$

Figure 19A:
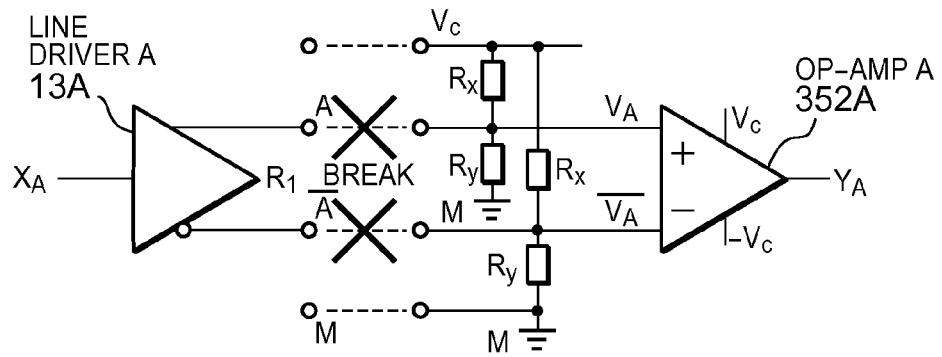
FIGS. 19A-19B are a circuit diagram (FIG. 19A) and a diagram (FIG. 19B) explaining operation during anomalies in the fifth embodiment.
Figure 19B:
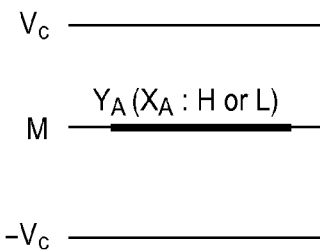

Next, FIG. 19A is a circuit diagram for a case in which there is a break in the cable 21 for both the differential signals A, A−, and FIG. 19B shows the level of the output signal YA. At this time, regardless of the logic of the A phase input signal XA, the input signals VA, VA− of the op-amp 352A are both values resulting from voltage division of the power supply voltage Vc by voltage-dividing resistors, as in equation (10).

$$VA = VA- = Vc \cdot Ry/(Rx + Ry) \qquad (10)$$

Hence VA−VA−=0, and the output signal YA of the op-amp 352A is the ground potential M, as indicated in FIG. 19B.

For this reason, the level of the output signal YA differs from the normal level in FIG. 18B, so that the level anomaly detection portion 333A of FIG. 16 detects the anomaly and outputs an anomaly detection signal to the outside.

When the power supply line or ground line connected to the encoder 11 breaks, power is no longer supplied to the encoder 11, so that the output signal YA of the op-amp 352A is again the ground potential M, and the level anomaly detection portion 333A can detect the anomaly.

Figure 20A:
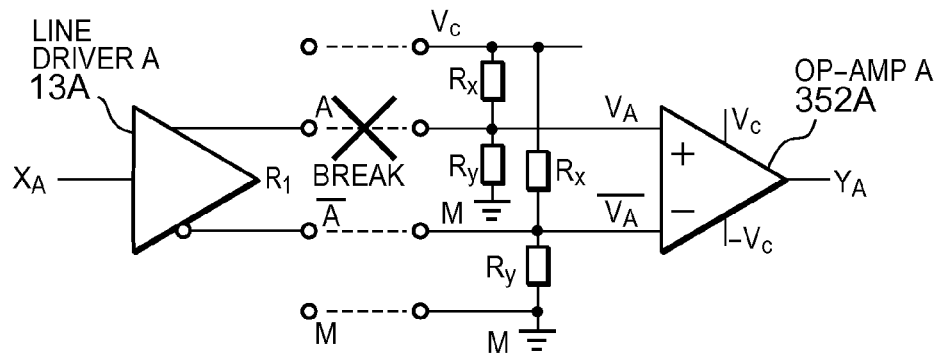
FIGS. 20A-20B are a circuit diagram (FIG. 20A) and a diagram (FIG. 20B) explaining operation during anomalies in the fifth embodiment.
Figure 20B:
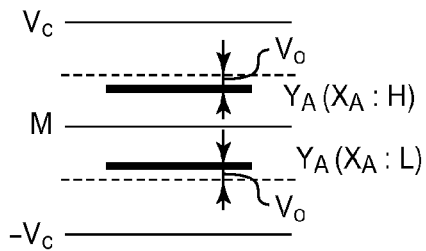

Next, FIG. 20A is a circuit diagram for a case in which there is a break in the cable 21 only on the side of the differential signal A, and FIG. 20B shows the level of the output signal YA. In this case, the output signal YA of the op-amp 352A is a different level according to the logic level of the A phase input signal XA.

That is, when the A phase input signal XA is at "H" level, the input signals VA, VA− of the op-amp 352A are given by equation (11).

$$VA = Vc \cdot Ry/(Rx+Ry)$$

$$VA- = M + V0 \tag{11}$$

Hence the output signal YA of the op-amp 352A is given by equation (12).

$$YA = VA - VA- = Vc \cdot Ry/(Rx+Ry) - V0 \tag{12}$$

When Rx=Ry, equation (12) becomes (Vc/2)−V0, and as shown in FIG. 20B, the voltage is reduced by V0 from the level indicated by the dashed line midway between M and Vc.

Further, when the A phase input signal XA is at "L" level, the above situation is reversed, and the output signal YA of the op-amp 352A is given by equation (13).

$$YA = VA - VA- = V0 - Vc \cdot Ry/(Rx+Ry) \tag{13}$$

When Rx=Ry, equation (13) becomes −(Vc/2)+V0, and as shown in FIG. 20B, the voltage is increased by V0 from the level indicated by the dashed line midway between M and −Vc.

Hence whether the A phase input signal XA is at "H" level or is at "L" level, the output signal YA of the op-amp 352A is at a level differing from the normal level of FIG. 18B, so that an anomaly can be detected.

When there is a break in the cable 21 only on the side of the differential signal A−, the logic of the A phase input signal XA and the relation between equations (12) and (13) are reversed, and an anomaly can similarly be detected.

Figure 21A:
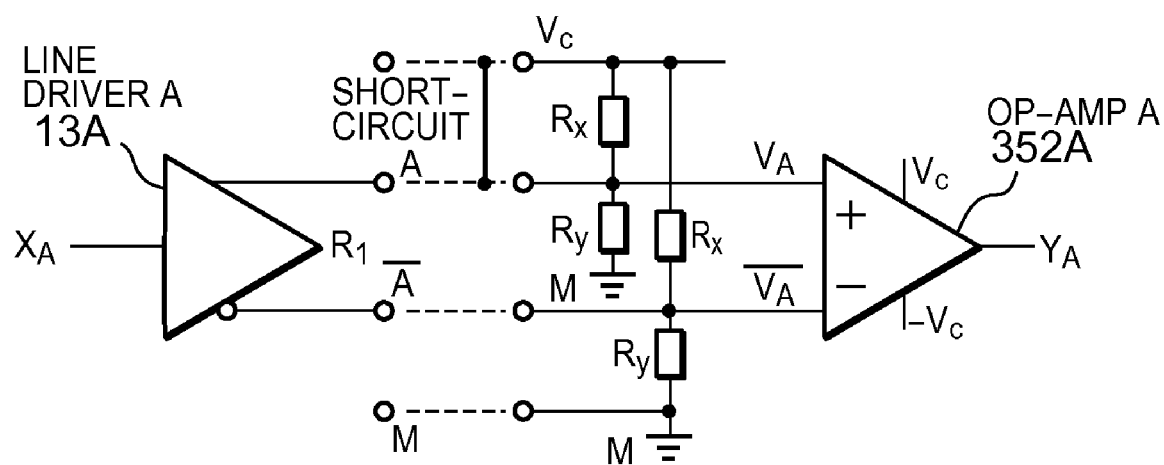
FIGS. 21A-21B are a circuit diagram (FIG. 21A) and a diagram (FIG. 21B) explaining operation during anomalies in the fifth embodiment.
Figure 21B:
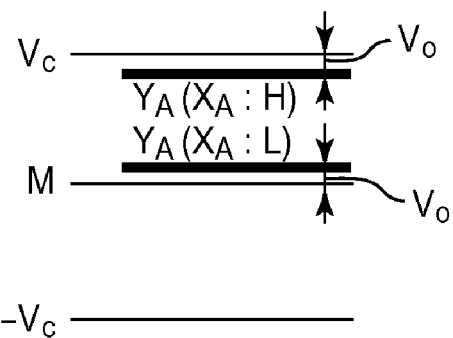

FIG. 21A is a circuit diagram for a case in which the cable 21 is short-circuited with the power supply line on the side of the differential signal A, and FIG. 21B shows the level of the output signal YA.

In this case, when the A phase input signal XA is at "H" level, the input signals VA, VA− of the op-amp 352A are given by equation (14).

$$VA = Vc$$

$$VA- = M + V0 \tag{14}$$

Hence, as indicated in FIG. 21B, the output signal YA of the op-amp 352A is given by equation (15).

$$YA = VA - VA- = Vc - V0 \tag{15}$$

In this case, as is clear by comparing FIG. 21B and FIG. 18B, the level of the output signal YA differs by V0 from the normal level. Hence if a resistor is inserted on the output side of the line driver 13A or other means are employed to make the value of V0 sufficiently large, reliable discrimination between normal operation and an anomaly due to a short-circuit with a power supply line is possible. And, when discrimination between normal operation and an anomaly is difficult because V0 is small, a judgment can be supplemented by the detection results of the pulse number comparison anomaly detection portion 336 and pulse width comparison anomaly detection portion 340, which perform anomaly detection during rotation.

On the other hand, when the A phase input signal XA is at "L" level, the input signals VA, VA− of the op-amp 352A are as given by equation (16).

$$VA = Vc$$

$$VA- = Vc - V0 \tag{16}$$

Hence, as indicated in FIG. 21B, the output signal YA of the op-amp 352A is given by equation (17).

$$YA = VA - VA- = V0 \tag{17}$$

Hence similarly to the case in which the A phase input signal XA is at "H" level, discrimination with normal operation is possible.

When the cable 21 is short-circuited with a power supply line on the side of the differential signal A−, the logic of the A phase input signal XA and the relation between equations (15) and (17) are reversed, and when the cable 21 is short-circuited with a ground line on the side of the differential signal A, VA in equations (14) and (16) is at ground potential, so that an anomaly can similarly be detected.

Figure 22:
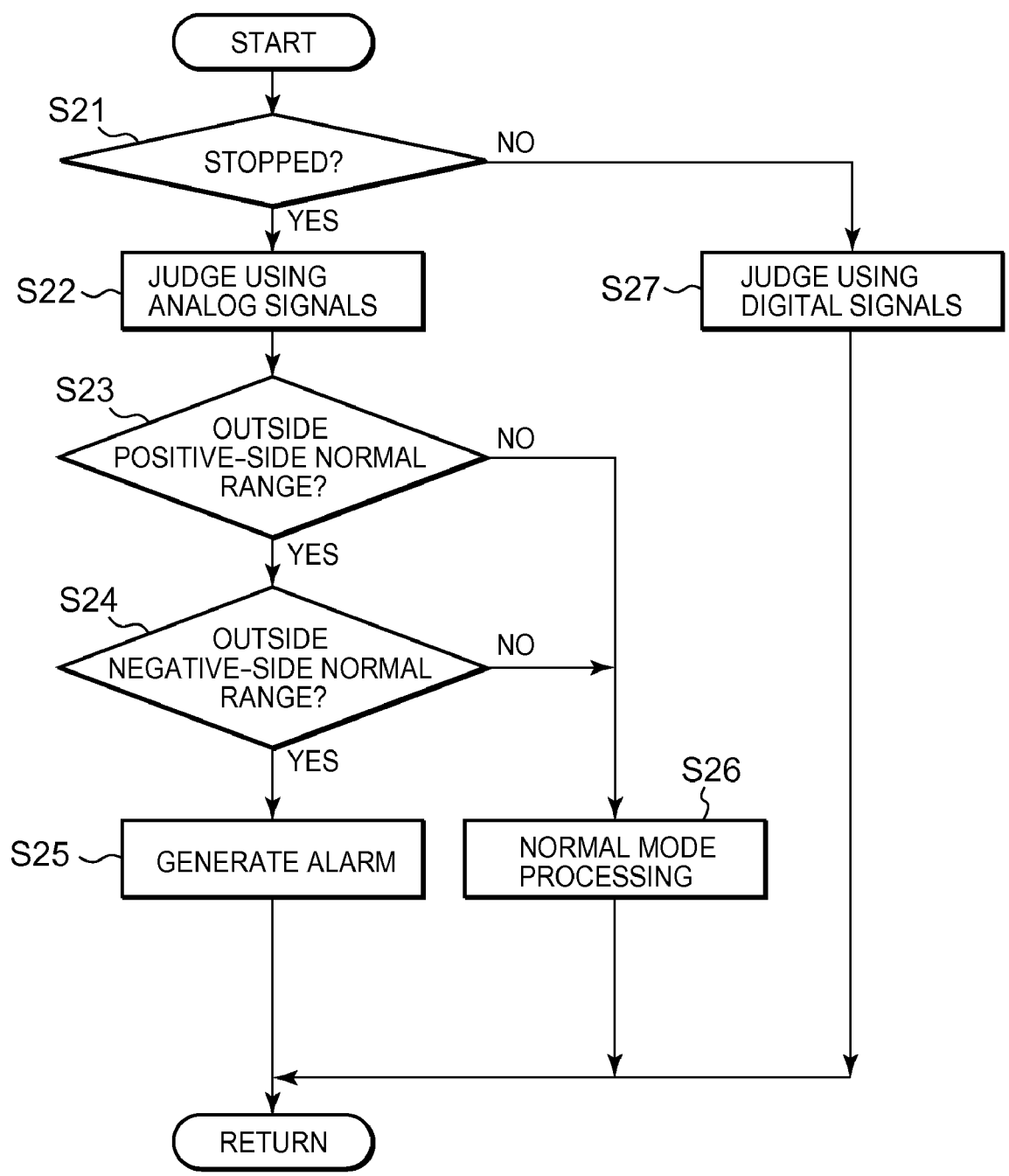
FIG. 22 is a flowchart showing anomaly detection operation in the fifth embodiment.

FIG. 22 is a flowchart showing anomaly detection operation in this embodiment.

First, a judgment is made as to whether the rotation member is rotating or is stopped, and if rotating, the digital signals SigA, SigB output from the line receivers 351A, 351B of FIG. 16 are used by the pulse number comparison anomaly detection portion 336 and pulse width comparison anomaly detection portion 340 to detect anomalies (No in step S21, step S27).

If the rotation member is stopped, the A phase and B phase analog signals SigAana, SigBana based on the above-described output signal YA of the op-amp 352A (and the output signal YB of the op-amp 352B) are used to perform anomaly judgment (Yes in step S21, step S22).

That is, for example the A phase analog signal SigAana based on the output signal YA is compared with the range of voltage levels on the positive side in normal operation (Vc−2V0) shown in FIG. 18B, with a detection error margin added (positive-side normal range), and if the level is judged to be outside this range (Yes in step S23), the signal is compared with the negative-side voltage level during normal operation (−Vc+2V0), with a detection error margin added (negative-side normal range) (step S24). Here, the margin value may be determined taking into consideration the AD conversion error, offset voltages of the op-amps 352A and 352B, and other factors.

And, when the signal is outside the normal range on the negative side as well (Yes in step S24), an anomaly is judged to have occurred, an anomaly detection signal (alarm) is generated (step S25). If the signal is within the normal range on either the positive side or the negative side (No in step S23 or No in step S24), normal mode processing, that is, a judgment that there is no anomaly in the encoder or wiring system, and continued driving of the motor or other rotation member, may be performed.

As explained in detail above, by means of this embodiment, breaks, short-circuits, and groundings within an encoder and wiring can be detected, without adding an AD conversion portion, even for a system employing a line driver type encoder 11.

The invention explained above can be employed for anomaly monitoring not only in motors, but in encoders and wiring systems for encoders to detect the rotation speed and position (angle) of various rotation members.

While the invention has been shown and described with reference to exemplary embodiments thereof, it will be understood by those skilled in the art that various changes may be made therein without departing from the spirit and scope of the invention. Therefore, the disclosed embodiments should be considered in light of illustration, rather than limitation. The scope of the present invention is defined by the appended claims, rather than the above-mentioned description. It should be interpreted that equivalents of the appended claims are included in the present invention.

What is claimed is:

1. An anomaly monitoring device for detecting anomalies in an encoder or a wiring system, in which output signals from the encoder which detects the position of a rotation member are input as analog input signals to a control device via the wiring system comprising a power supply line and a signal line, and the control device processes the analog input signals and detects anomalies in the encoder or the wiring system, the anomaly monitoring device comprising:
a converting device configured to convert voltage level input signals, which are obtained from the analog input signals, into first digital signals;
a voltage level based device configured to detect anomalies in the encoder or the wiring system based on the voltage level of the analog input signals measured from the first digital signals;
a pulse number based device configured to detect anomalies in the encoder or the wiring system based on the number of pulses of second digital signals which are obtained by converting at least two of the analog input signals; and
a pulse width based device configured to detect anomalies in the encoder or the wiring system based on the pulse widths of third digital signals which are obtained from the second digital signals.

2. The anomaly monitoring device according to claim 1, wherein the analog input signals are input as the voltage level input signals to the converting device, and the third digital signals are respectively obtained by combining at least two of the second digital signals.

3. The anomaly monitoring device according to claim 1, wherein the analog input signals are input as the voltage level input signals to the converting device and at least two of the second digital signals are input as the third digital signals to the pulse width based device.

4. The anomaly monitoring device according to claim 1, further comprising
a voltage level measurement device configured to convert the analog input signals to analog signals with a prescribed level as the voltage level input signals,
wherein the analog input signals are a plurality of sets of differential signals, the second digital signals are converted from at least two of the sets of differential signals with reference to the ground potential of the control device, and at least two of the second digital signals are input as the third digital signals to the pulse width based device.

5. The anomaly monitoring device according to claim 1, wherein anomalies are detected by the voltage level based device when the rotation member is stopped, and anomalies are detected by the pulse number based device or the pulse width based device when the rotation member is rotating.

6. The anomaly monitoring device according to claim 1, further comprising
a bias generation device configured, when the encoder output is at "High" level, to cause the voltage level of the analog input signals of the control device to be an analog high level resulting by subtracting a bias portion from a power supply voltage, and when the encoder output is at "Low" level, to cause the voltage level of the analog input signals to be an analog low level resulting by adding a bias portion to the ground level,
wherein the voltage level based device judges that there is a break in the signal line or in the power supply line when the voltage level of the analog input signal exists between the analog high level and the analog low level, judges that there is a short-circuit between the signal line and the power supply line when the level is closer to the power supply voltage than to the analog high level, and judges that the signal line is grounded when the level is closer to the ground level than to the analog low level.

7. The anomaly monitoring device according to claim 1, wherein the pulse number based device detects the edges of the pulses of at least two of the second digital signals, determines the number of pulses respectively, and detects anomalies when the difference in the numbers of pulses is equal to or greater than a prescribed threshold value.

8. The anomaly monitoring device according to claim 1, wherein the pulse width based device compares the pulse widths of the third digital signals in a fixed period with the pulse widths in a past fixed period, and detects anomalies when there is a difference in the pulse widths.

9. The anomaly monitoring device according to claim 1, wherein the control device includes a processing unit and the processing unit performs an analog/digital conversion function of the converting device, a pulse number measurement function of the pulse number based device, and a pulse width measurement function of the pulse width based device.

10. The anomaly monitoring device according to claim 1, wherein the control device includes multiple redundant processing units, the multiple redundant processing units mutually transmit and receive data including voltage levels of the analog input signals measured by the voltage level based device, numbers of pulses measured by the pulse number based device, and pulse widths measured by the pulse width based device, and each of the multiple redundant processing units compares the transmitted and received data to detect anomalies in the multiple redundant processing units.

11. The anomaly monitoring device according to claim 3, wherein the pulse width based device detects anomalies when the difference in the pulse widths of the third digital signals in a fixed period is equal to or greater than a prescribed threshold value.

12. The anomaly monitoring device according to claim 4, wherein the voltage level measurement device includes an analog operation device, and the voltage level based device detects anomalies in the encoder or the wiring system when the voltage level of an analog output signal from the analog operation device is outside a positive-side normal range and outside a negative-side normal range.

13. The anomaly monitoring device according to claim 12, wherein the analog operation device, to which at least one of the sets of differential signals are input, is a dual-power supply type analog operation device.

14. The anomaly monitoring device according to claim 12, wherein the analog operation device, to which at least one of the sets of differential signals are input, employs a single power supply with an offset voltage superposed.

15. A method for providing an anomaly monitoring system, in which output signals from an encoder which detects the position of a rotation member are input as analog input signals to a control device via a wiring system comprising a power supply line and a signal line, and the control device processes the analog input signals and detects anomalies in the encoder or the wiring system, the method comprising:
converting voltage level input signals which are obtained from the analog input signals, into first digital signals;

detecting anomalies in the encoder or the wiring system based on the voltage level of the analog input signals measured from the first digital signals;

detecting anomalies in the encoder or the wiring system based on the number of pulses of second digital signals which are obtained by converting at least two of the analog input signals; and detecting anomalies in the encoder or the wiring system based on the pulse widths of third digital signals which are obtained from the second digital signals.

16. The method of claim 15, wherein the analog input signals are used as the voltage level input signals and the third digital signals are respectively obtained by combining at least two of the second digital signals.

17. The method of claim 15, wherein the analog input signals are used as the voltage level input signals and in the step of detecting anomalies based on the widths of pulses, at least two of the second digital signals are used as the third digital signals.

18. The method of claim 15, further comprising measuring the voltage level of the analog input signals by converting the analog input signals to analog signals with a prescribed level as the voltage level input signals, wherein the analog input signals are a plurality of sets of differential signals, the second digital signals are converted from at least two of the sets of differential signals with reference to the ground potential of the control device, and in the step of detecting anomalies based on the pulse widths, at least two of the second digital signals are used as the third digital signals.

19. The method of claim 15, wherein anomalies are detected in the step of detecting anomalies based on the voltage level when the rotation member is stopped, and anomalies are detected in the step of detecting anomalies based on the number of pulses or in the step of detecting anomalies based on the pulse widths, when the rotation member is rotating.

20. The method of claim 15, further comprising generating a bias, when the encoder output is at "High" level, to cause the voltage level of the analog input signals of the control device to be an analog high level resulting by subtracting a bias portion from a power supply voltage, and when the encoder output is at "Low" level, to cause the voltage level of the analog input signals to be an analog low level resulting by adding a bias portion to the ground level, wherein the step of detecting anomalies based on the voltage level, includes the steps of:

judging that there is a break in the signal line or in the power supply line when the voltage level of the analog input signal exists between the analog high level and the analog low level, judging that there is a short-circuit between the signal line and the power supply line when the level is closer to the power supply voltage than to the analog high level, and judging that the signal line is grounded when the level is closer to the ground level than to the analog low level.

21. The method of claim 15, wherein the step of detecting anomalies based on the number of pulses, includes the steps of:

detecting the edges of the pulses of at least two of the second digital signals, determines the number of pulses respectively, and detecting anomalies when the difference in the numbers of pulses is equal to or greater than a prescribed threshold value.

22. The method of claim 15, wherein the step of detecting anomalies based on the pulse widths, includes the steps of:

comparing the pulse widths of the third digital signals in a fixed period with the pulse widths in a past fixed period, and detecting anomalies when there is a difference in the pulse widths.

23. The method of claim 15, wherein the control device includes a processing unit and the processing unit performs an analog/digital conversion function in the step of converting the voltage level input signals, a pulse number measurement function in the step of detecting anomalies based on the number of pulses, and a pulse width measurement function in the step of detecting anomalies based on the pulse width.

24. The method of claim 15, wherein the control device includes multiple redundant processing units, the multiple redundant processing units mutually transmit and receive data including voltage levels of the analog input signals measured in the step of detecting anomalies based on the voltage level, numbers of pulses measured in the step of detecting anomalies based on the number of pulses, and pulse widths measured in the step of detecting anomalies based on the pulse widths, and each of the multiple redundant processing units compares the transmitted and received data to detect anomalies in the multiple redundant processing units.

25. The method of claim 17, wherein in the step of detecting anomalies based on the pulse width, anomalies are detected when the difference in the pulse widths of the third digital signals in a fixed period is equal to or greater than a prescribed threshold value.

26. The method of claim 18, wherein an analog operation device is used in the step of measuring the voltage level, and in the step of detecting anomalies based on the voltage level, anomalies are detected in the encoder or the wiring system when the voltage level of an analog output signal from the analog operation device is outside a positive-side normal range and outside a negative-side normal range.

27. The method of claim 26, wherein the analog operation device, to which at least one of the sets of differential signals are input, is a dual-power supply type analog operation device.

28. The method of claim 26, wherein the analog operation device, to which at least one of the sets of differential signals are input, employs a single power supply with an offset voltage superposed.

* * * * *